United States Patent
Takamoto et al.

(10) Patent No.: US 8,513,816 B2
(45) Date of Patent: Aug. 20, 2013

(54) FILM FOR FLIP CHIP TYPE SEMICONDUCTOR BACK SURFACE CONTAINING THERMOCONDUCTIVE FILLER

(75) Inventors: Naohide Takamoto, Osaka (JP); Goji Shiga, Osaka (JP); Fumiteru Asai, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/173,226

(22) Filed: Jun. 30, 2011

(65) Prior Publication Data

US 2012/0025399 A1    Feb. 2, 2012

(30) Foreign Application Priority Data

Jul. 29, 2010    (JP) .................................. 2010-170931

(51) Int. Cl.
| | |
|---|---|
| H01L 23/48 | (2006.01) |
| H01L 21/50 | (2006.01) |
| C09K 5/00 | (2006.01) |
| B32B 7/12 | (2006.01) |
| B32B 3/00 | (2006.01) |

(52) U.S. Cl.
USPC ............... 257/778; 257/E23.01; 257/E21.499; 257/E23.101; 257/E23.135; 257/E23.069; 257/737; 257/738; 257/783; 257/712; 257/713; 252/73; 438/108; 438/455; 428/354; 428/141

(58) Field of Classification Search
USPC .......... 257/778, 737, 738, 734, 707, 712, 257/713, 706, 717, 720, E23.135, E23.101, 257/E23.069, 783, E21.499, E23.01; 252/73; 438/141, 354; 428/141, 354
See application file for complete search history.

(56) References Cited

U.S. PATENT DOCUMENTS

| | | | | | |
|---|---|---|---|---|---|
| 5,847,929 | A | * | 12/1998 | Bernier et al. | ................. 361/719 |
| 6,069,023 | A | * | 5/2000 | Bernier et al. | ................. 438/107 |
| 6,251,707 | B1 | * | 6/2001 | Bernier et al. | ................. 438/122 |
| 6,569,536 | B2 | * | 5/2003 | Tsuji et al. | .................... 428/447 |
| 7,291,671 | B2 | * | 11/2007 | Fukui | ............................ 524/588 |
| 7,956,121 | B2 | * | 6/2011 | Sekiba | ........................... 524/588 |
| 7,999,033 | B2 | * | 8/2011 | Sekiba | ........................... 524/588 |

(Continued)

FOREIGN PATENT DOCUMENTS

| | | | |
|---|---|---|---|
| JP | 60-255846 | * | 12/1985 |
| JP | 6-334288 | * | 12/1994 |

(Continued)

OTHER PUBLICATIONS

Communication, dated Mar. 25, 2013, issued by the Japanese Patent Office in counterpart Japanese Patent Application No. 2010-170931.

*Primary Examiner* — A O Williams
(74) *Attorney, Agent, or Firm* — Sughrue Mion, PLLC

(57) ABSTRACT

The present invention relates to a film for flip chip type semiconductor back surface, which is to be disposed on the back surface of a semiconductor element to be flip chip-connected onto an adherend, the film containing a resin and a thermoconductive filler, in which the content of the thermoconductive filler is at least 50% by volume of the film, and the thermoconductive filler has an average particle size relative to the thickness of the film of at most 30% and has a maximum particle size relative to the thickness of the film of at most 80%.

8 Claims, 2 Drawing Sheets

(56) References Cited

U.S. PATENT DOCUMENTS

| | | | |
|---|---|---|---|
| 8,093,331 B2* | 1/2012 | Fukui | 524/588 |
| 8,138,254 B2* | 3/2012 | Fukui | 524/430 |
| 2002/0070445 A1* | 6/2002 | Tarter | 257/714 |
| 2003/0180484 A1* | 9/2003 | Imai et al. | 428/34.1 |
| 2004/0195678 A1* | 10/2004 | Yamazaki et al. | 257/720 |
| 2005/0151243 A1* | 7/2005 | Mok | 257/707 |
| 2005/0228093 A1* | 10/2005 | Yamazaki et al. | 524/404 |
| 2006/0091528 A1* | 5/2006 | Yang | 257/706 |
| 2007/0241303 A1* | 10/2007 | Zhong et al. | 252/62.3 T |
| 2009/0053518 A1 | 2/2009 | Saiki et al. | |
| 2009/0135687 A1* | 5/2009 | Mori et al. | 369/44.41 |
| 2010/0116431 A1* | 5/2010 | Pawlenko et al. | 156/280 |
| 2010/0130673 A1* | 5/2010 | Ito et al. | 524/588 |

FOREIGN PATENT DOCUMENTS

| | | | |
|---|---|---|---|
| JP | 2007-158026 A | | 6/2007 |
| JP | 2008-166451 A | | 7/2008 |
| JP | 2010-56328 A | | 3/2010 |
| JP | 2010-77389 A | | 4/2010 |
| JP | 2010-135621 A | | 6/2010 |
| JP | 2011-132547 | * | 7/2011 |
| WO | 2007/119507 A1 | | 10/2007 |

* cited by examiner

FILM FOR FLIP CHIP TYPE SEMICONDUCTOR BACK SURFACE CONTAINING THERMOCONDUCTIVE FILLER

FIELD OF THE INVENTION

The present invention relates to a film for flip chip type semiconductor back surface, and to a dicing tape-integrated film for semiconductor back surface. The film for flip chip type semiconductor back surface is used for protecting the back surface of a semiconductor element such as a semiconductor chip and for enhancing the strength thereof. Moreover, the invention relates to a method for producing a semiconductor device using the dicing tape-integrated film for semiconductor back surface, and to a flip chip-mounted semiconductor device.

BACKGROUND OF THE INVENTION

Recently, thinning and miniaturization of a semiconductor device and its package have been increasingly demanded. Therefore, as the semiconductor device and its package, flip chip type semiconductor devices in which a semiconductor element such as a semiconductor chip is mounted (flip chip-connected) on a substrate by means of flip chip bonding have been widely utilized. In such flip chip connection, a semiconductor chip is fixed to a substrate in a form where the circuit face of the semiconductor chip is opposed to the electrode-formed face of the substrate. In such a semiconductor device or the like, there may be a case where the back surface of the semiconductor chip is protected with a protective film to prevent the semiconductor chip from damaging or the like (see, Patent Document 1). The film for back surface may be laser-marked to increase the product discrimination ability thereof (see, Patent Document 2).

[Patent Document 1] JP-A-2007-158026
[Patent Document 2] JP-A-2008-166451

With the progress of semiconductor technology, semiconductor device performance is being improved day by day. With the increase in the processing speed of semiconductor devices, the amount of heat to be generated by semiconductor devices tends to increase. In case where the back surface of a semiconductor element such as a semiconductor chip is covered with a back surface film, the heat release from the side of the back surface of the semiconductor element is retarded and therefore the generated heat may be accumulated in the semiconductor device to give a load to the device to thereby shorten the product life. Against this background, there may be taken a method of roughening the surface of the film for back surface to increase the surface area thereof to thereby promote the heat release from the back surface film. However, roughening the surface of the back surface film may produce another problem in that the laser markability of the film may worsen and the adhesiveness thereof to semiconductor wafers etc. may also worsen.

SUMMARY OF THE INVENTION

The present invention has been made in consideration of the foregoing problem and an object thereof is to provide a film for flip chip type semiconductor back surface which, when disposed on the back surface of a semiconductor element, can efficiently release outside the heat from the semiconductor element while keeping its good laser markability on the surface thereof and its good adhesiveness to semiconductor wafers etc., and to provide a dicing tape-integrated film for semiconductor back surface that comprises the film for flip chip type semiconductor back surface.

Another object of the invention is to provide a method for producing a semiconductor device which is high in the product discrimination ability owing to laser marking and can efficiently release the heat generated by the semiconductor element therein to thereby prolong the product life.

In order to solve the foregoing problems, the present inventors made extensive and intensive investigations. As a result, the inventors have found that, when a specific thermoconductive filler is incorporated in the film for flip chip type semiconductor back surface, then the ability of the film to release heat from semiconductor elements can be enhanced while good laser markability thereof and good adhesiveness thereof to semiconductor wafers are kept as such, and have completed the present invention.

Namely, the present invention provides a film for flip chip type semiconductor back surface, which is to be disposed on the back surface of a semiconductor element to be flip chip-connected onto an adherend, the film comprising a resin and a thermoconductive filler, in which the content of the thermoconductive filler is at least 50% by volume of the film, and the thermoconductive filler has an average particle size relative to the thickness of the film of at most 30% and has a maximum particle size relative to the thickness of the film of at most 80%.

The film for flip chip type semiconductor back surface of the invention is to be disposed on the back surface of a semiconductor element that is flip chip-connected onto an adherend, thereby fulfilling the function thereof to protect the semiconductor element. The film for flip chip type semiconductor back surface contains a resin and a thermoconductive filler, in which the content of the thermoconductive filler is at least 50% by volume; and therefore, the thermal conductivity of the film itself is high and the film exhibits excellent heat radiation capability and, as a result, even when the film is disposed on the back surface of a semiconductor element, it can efficiently release the heat generated by the semiconductor element to the outside. The back surface of the semiconductor element means the surface opposite to the surface thereof on which a circuit is formed.

Regarding the morphology of the thermoconductive filler, when the particle size thereof is larger, then the filler of the type can increase the ratio of the region having good thermal conductivity in the film for flip chip type semiconductor back surface, thus increasing the thermal conductivity of the entire film for flip chip type semiconductor back surface. On the other hand, however, when the particle size of the thermoconductive filler is too large, then the thermal conductivity of the film may increase but the shape of the thermoconductive filler may have some influence on the film surface to thereby detract from the surface smoothness of the film. Regarding the morphology of the thermoconductive filler in the film for flip chip type semiconductor back surface of the invention, the average particle size and the maximum particle size of the filler relative to the thickness of the film for flip chip type semiconductor back surface are at most 30% and at most 80%, respectively; and therefore in the film for flip chip type semiconductor back surface, the thermal conductivity of the thermoconductive filler is maximized as well as the influence of the shape of the thermoconductive filler on the surface condition of the film is minimized. Employing the thermoconductive filler having the morphology as above in the film makes it possible to define the content of the thermoconductive filler in the film to be a high level of at least 50% by volume. When the average particle size and the maximum particle size relative to the thickness of the film is more than 30% and more than 80%, respectively, then the surface roughness of the film is too high and the laser markability thereof is thereby worsened and the adhesiveness thereof to semiconductor wafers etc. is also worsened. In the film of the invention, the content of the thermoconductive filler and the average particle size and the maximum particle size thereof are defined each to fall within a predetermined range, and therefore in the film, the thermoconductive filler is relatively densely packed and the contact points of the thermoconductive filler particles are large, and accordingly, the thermal conductivity of the film and even the heat radiation performance thereof can be thereby increased up to a high level. In addition, since the thermoconductive filler is packed densely in the film, the thermoconductive filler particles can be homogenized in some degree in the area around the surface of the film to secure the film surface smoothness. In this description, the average particle size and the maximum particle size of the thermoconductive filler mean values measured with a laser diffraction particle sizer.

Preferably, the thermal conductivity of the film for flip chip type semiconductor back surface of the invention is at least 2 W/mK. Having the thermal conductivity on this level, the film can efficiently release outside the heat generated by the semiconductor element attached thereto.

Preferably, the surface roughness (Ra) of the film for flip chip type semiconductor back surface on the side opposite to the side thereof to face the back surface of a semiconductor is at most 300 nm. Since the filler contains a thermoconductive filler having a specific morphology in a specifically defined amount, the surface roughness (Ra) of the film can be at most 300 nm, and as a result, the laser markability of the film can be thereby improved and the adhesiveness thereof to semiconductor wafers etc. can be prevented from lowering. In this description, the surface roughness (Ra) is measured according to JIS B0601, and its details are described in Examples given below.

Preferably, the content of the thermoconductive filler is from 50 to 80% by volume, and relative to the thickness of the film, the average particle size of the thermoconductive filler is from 10 to 30% and the maximum particle size thereof is from 40 to 80%. Specifically defining the content and the morphology of the thermoconductive filler makes it possible to further enhance the heat radiation capability of the film for flip chip type semiconductor back surface of the invention and to further enhance the laser markability of the film and the excellent adhesiveness thereof to semiconductor wafers and others.

The film for flip chip type semiconductor back surface of the invention may contain, as the thermoconductive filler, a plurality of thermoconductive filler particles that differ in average particle sizes thereof. Of the thermoconductive filler particles having different average particle sizes, those having a smaller average particle size may be filled between those having a larger average particle size whereby the region of good thermal conductivity can be enlarged and the thermal conductivity of the film can be thereby increased. Regarding the average particle size, two types of fillers having different average particle sizes may be employed, or three or more types of fillers having different average particle sizes may be employed. In case where thermoconductive filler particles that differ in average particle sizes are employed, the average particle size of the thermoconductive filler in the invention means the average of the average particle sizes of the thermoconductive filler particles that differ in average particle sizes; and the maximum particle size of the thermoconductive filler means the largest particle size of all the thermoconductive filler particles contained in the film.

The present invention also provides a dicing tape-integrated film for semiconductor back surface, which comprises: a dicing tape and the above-mentioned film for flip chip type semiconductor back surface, which is laminated on the dicing tape, in which the dicing tape comprises a base material and a pressure-sensitive adhesive layer laminated on the base material, and the film for flip chip type semiconductor back surface is laminated on the pressure-sensitive adhesive layer of the dicing tape.

In the dicing tape-integrated film for semiconductor back surface having the above-mentioned constitution, since the dicing tape and the film for flip chip type semiconductor back surface are integrated, the dicing tape-integrated film of this type can be used in a process comprising a dicing step of dicing a semiconductor wafer to produce a semiconductor element and the subsequent picking up step. Specifically, when a dicing tape is attached to the back surface of a semiconductor wafer prior to the dicing step, the film for semiconductor back surface can also be attached thereto at the same time, and therefore, the process does not require a step of attaching the film for semiconductor back surface alone to the semiconductor wafer (semiconductor back surface film attaching step). As a result, the number of the processing steps may be reduced. Moreover, in the process, since the film for semiconductor back surface protects the back surface of the semiconductor wafer and that of the semiconductor element formed by dicing, damaging of the semiconductor element can be prevented or reduced in the dicing step and in the subsequent step (picking up step). As a result, the production yield of the flip chip type semiconductor device to be produced can be increased.

The present invention further provides a method for producing a semiconductor device by using the above-mentioned dicing tape-integrated film for semiconductor back surface, the method comprising: attaching a semiconductor wafer onto the film for flip chip type semiconductor back surface of the dicing tape-integrated film for semiconductor back surface, dicing the semiconductor wafer to form a semiconductor element, peeling the semiconductor element from the pressure-sensitive adhesive layer of the dicing tape, along with the film for flip chip type semiconductor back surface, and flip chip-connecting the semiconductor element onto an adherend.

In the above-mentioned method, the dicing tape-integrated film for semiconductor back surface is attached to the back surface of a semiconductor wafer, and therefore the method does not require a step of attaching the film for semiconductor back surface alone (semiconductor back surface film attaching step). In addition, in dicing the semiconductor wafer and in picking up the semiconductor element produced by the dicing, the back surface of the semiconductor wafer and that of the semiconductor element are protected by the film for semiconductor back surface, and the semiconductor wafer and element can be thereby prevented from being damaged. As a result, the production yield can be increased in producing flip chip type semiconductor devices.

The present invention furthermore provides a flip chip type semiconductor device produced in accordance with the above-mentioned method for producing a semiconductor device.

The film for flip chip type semiconductor back surface of the invention is to be disposed on the back surface of a semiconductor element that is flip chip-connected to an adherend, thereby fulfilling the function thereof to protect the semiconductor element. In addition, the film for flip chip type semiconductor back surface contains a resin and a thermoconductive filler, in which the content of the thermoconductive filler is at least 50% by volume; and therefore, the thermal conductivity of the film itself is high and the film exhibits excellent heat radiation capability and, as a result, even when the film is disposed on the back surface of a semiconductor element, it can efficiently release outside the heat generated by the semiconductor element. In the film for flip chip type semiconductor back surface of the invention, the average particle size and the maximum particle size of the filler relative to the thickness of the film for flip chip type semiconductor back surface are at most 30% and at most 80%, respectively; and therefore in the film for flip chip type semiconductor back surface, the thermal conductivity of the thermoconductive filler is maximized and the influence of the shape of the thermoconductive filler on the surface condition of the film is minimized.

In the dicing tape-integrated film for semiconductor back surface of the invention, the dicing tape and the film for flip chip type semiconductor back surface are integrated, and therefore, the film can be used in a process comprising a dicing step of dicing a semiconductor wafer to produce a semiconductor element and the subsequent picking up step. As a result, the process does not require a step of attaching the film for semiconductor back surface alone to a semiconductor wafer (semiconductor back surface film attaching step). Moreover, in the subsequent dicing step and picking up step, since the film for semiconductor wafer is attached to the back surface of the semiconductor wafer and that of the semiconductor element produced by dicing, the semiconductor wafer and the semiconductor element can be effectively protected and the semiconductor element can be prevented from being damaged. After bonding of the semiconductor element to a substrate or the like, the film for flip chip type semiconductor back surface exhibits the function thereof to protect the back surface of the semiconductor element and smoothly releases the heat from the semiconductor element; and in addition, owing to the excellent laser markability of the film, the semiconductor element can be well discriminated from others. Further, the film secures good adhesiveness to semiconductor wafers.

According to the semiconductor device production method of the invention, the dicing tape-integrated film for semiconductor back surface is attached to the back surface of a semiconductor wafer, and therefore the method does not require a step of attaching the film for semiconductor back surface alone. In addition, in dicing the semiconductor wafer and in picking up the semiconductor element produced by the dicing, the back surface of the semiconductor wafer and that of the semiconductor element are protected by the film for semiconductor back surface, and the semiconductor wafer and element can be thereby prevented from being damaged. Having the above-mentioned advantages, the production yield of the production method of the invention is high and the method can efficiently produce a flip chip type semiconductor device having excellent heat radiation capability, excellent laser markability and excellent adhesiveness to semiconductor wafers.

DESCRIPTION OF REFERENCE NUMERALS AND SIGNS

1   Dicing Tape-Integrated Film for Semiconductor Back Surface
2   Film for Semiconductor Back Surface
3   Dicing Tape
31  Base Material
32  Pressure-Sensitive Adhesive Layer
33  Part Corresponding to Semiconductor Wafer-Attaching Part
4   Semiconductor Wafer
5   Semiconductor Chip
51  Bump Formed on the Circuit Face Side of Semiconductor Chip 5
6   Adherend
61  Conductive Material for Conjunction Attached to Connection Pad of Adherend 6

BEST MODE FOR CARRYING OUT THE INVENTION

Figure 1:
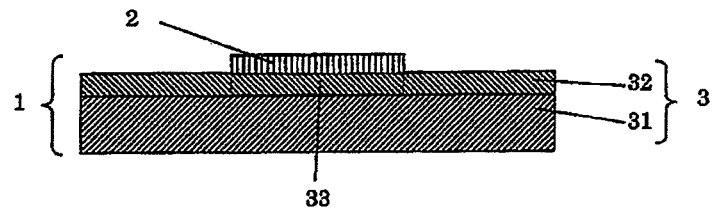
FIG. 1 is a cross-sectional schematic view showing one embodiment of a dicing tape-integrated film for semiconductor back surface of the invention.

Embodiments of the present invention are described with reference to FIG. 1 but the invention is not restricted to these embodiments. FIG. 1 is a cross-sectional schematic view showing one embodiment of a dicing tape-integrated film for semiconductor back surface according to the present embodiment. Incidentally, in the figures in the present specification, parts that are unnecessary for the description are not given, and there are parts shown by magnifying, minifying, etc. in order to make the description easy.

(Dicing Tape-Integrated Film for Semiconductor Back Surface)

As shown in FIG. 1, the dicing tape-integrated film for semiconductor back surface 1 (hereinafter sometimes also referred to as "dicing tape-integrated semiconductor back surface protective film", "film for semiconductor back surface with dicing tape", or "semiconductor back surface protective film with dicing tape") has a configuration including: the dicing tape 3 including the pressure-sensitive adhesive layer 32 formed on the base material 31, and, as formed on the pressure-sensitive adhesive layer 32, the film for flip chip type semiconductor back surface 2 (hereinafter sometimes referred to as "film for semiconductor back surface" or "semiconductor back surface protective film"). Also as shown in FIG. 1, the dicing tape-integrated film for semiconductor back surface of the invention may be so designed that the film for semiconductor back surface 2 is formed only on the part 33 corresponding to the semiconductor wafer-attaching part; however, the film for semiconductor back surface may be formed over the whole surface of the pressure-sensitive adhesive layer 32, or the film for semiconductor back surface may be formed on the part larger than the part 33 corresponding to the semiconductor wafer-attaching part but smaller than the whole surface of the pressure-sensitive adhesive layer 32. Incidentally, the surface of the film for semiconductor back surface 2 (surface to be attached to the back surface of wafer) may be protected with a separator or the like until the film is attached to wafer back surface.

(Film for Flip Chip Type Semiconductor Back Surface)

The film for semiconductor back surface 2 has a film shape. The film for semiconductor back surface 2 is usually in an uncured state (including a semi-cured state) in the embodiment of the dicing tape-integrated film for semiconductor back surface as a product and is thermally cured after the dicing tape-integrated film for semiconductor back surface is attached to the semiconductor wafer (details are described below).

The film 2 for flip chip type semiconductor back surface of the invention contains a thermoconductive filler. Not specifically defined, the thermal conductivity of the thermoconductive filler may be any one capable of imparting thermal conductivity to the film 2 for semiconductor back surface but is preferably at least 12 W/mK, more preferably from 15 to 70 W/mK, even more preferably from 25 to 70 W/mK. When the thermal conductivity is at least 12 W/mK, then the filler may impart thermal conductivity of at least 1.5 W/mK to the film 2 for semiconductor back surface. However, when the thermal conductivity of the thermoconductive filler is more than 70 W/mK, then the production cost may increase.

Not specifically defined, the thermoconductive filler includes, for example, insulating materials such as aluminum oxide, zinc oxide, magnesium oxide, boron nitride, magnesium hydroxide, aluminum nitride, and silicon carbide. One or more of these may be used here either singly or as combined. Above all, aluminum oxide is preferred as having high electroconductivity, excellent in dispersibility in the film 2 for semiconductor back surface, and available with ease.

The content of the thermoconductive filler is at least 50% by volume, preferably from 50 to 80% by volume, more preferably from 55 to 75% by volume, of the film 2 for semiconductor back surface. When the content of the thermoconductive filler is within the above range, then the thermal conductivity of the film for semiconductor back surface itself can be high and the film can exhibit excellent heat radiation capability and, as a result, even when the film is disposed on the back surface of a semiconductor element, the film can efficiently release outside the heat generated by the semiconductor element. When the content is less than 50% by volume, then the thermal conductivity of the film 2 for semiconductor back surface is low and the ability of the film to release the heat from semiconductor elements will be insufficient whereby the heat may be accumulated inside semiconductor elements. On the other hand, when the content is at most 80% by volume, then the relative reduction in the content of the adhesive component in the film 2 for semiconductor back surface may be prevented and the film 2 for semiconductor back surface can thereby secure the wettability and the adhesiveness thereof to semiconductor wafers and others.

In the film 2 for semiconductor back surface, the average particle size of the thermoconductive filler is at most 30%, preferably from 10 to 30%, more preferably from 15 to 25%, relative to the film for flip chip type semiconductor back surface. The maximum particle size of the thermoconductive filler is at most 80%, preferably from 40 to 80%, more preferably from 50 to 70%, relative to the thickness of the film for semiconductor back surface. When the particle size of the thermoconductive filler is defined to fall within the above range, then the thermal conductivity of the thermoconductive filler may be maximized and the influence of the shape of the thermoconductive filler on the surface condition of the film for semiconductor back surface may be minimized. Employing the thermoconductive filler having the particle size as above in the film makes it possible to define the content of the thermoconductive filler in the film to be a high level of at least 50% by volume. When the average particle size and the maximum particle size relative to the thickness of the film are more than 30% and more than 80%, respectively, then the surface roughness of the film is too high and the laser markability thereof is thereby worsened and the adhesiveness of the film for semiconductor back surface to semiconductor wafers and others is also worsened.

The average particle size of the thermoconductive filler is not specifically defined so far as its value relative to the thickness of the film for semiconductor back surface is as above. Concretely, in case where the thickness of the film for semiconductor back surface is 10 µm, the average particle size of the filler is preferably from 0.05 to 3 µm, more preferably from 0.1 to 2 µm. The maximum particle size the thermoconductive filler is not also specifically defined so far as its value relative to the thickness of the film for semiconductor back surface is as above. Concretely, the maximum particle size is preferably from 0.2 to 8 µm, more preferably from 0.5 to 7 µm. When the average particle size and the maximum particle size are not lower than the above-mentioned range, then any excessive reduction in the thermal conductivity of the film 2 for semiconductor back surface may be prevented and the heat radiation capability and the heat resistance of the film may be thereby enhanced. On the other hand, when the average particle size and the maximum particle size are not higher than the above-mentioned range, then the laser markability and the adhesiveness of the film may be prevented from lowering. The average particle size is measured using a laser diffraction particle sizer (LA-910, manufactured by HORIBA. Ltd.).

The thermoconductive filler may comprise two or more different kinds of thermoconductive fillers that differ in the average particle sizes thereof. In consideration of the content of the thermoconductive filler, the thermal conductivity of the film for semiconductor back surface and the surface smoothness easy controllability of the film, preferred is use of two different types of thermoconductive fillers that differ in the average particle size thereof. Also in this case, the particle size of the fillers is not specifically defined so far as the value thereof relative to the thickness of the film for semiconductor back surface falls within the predetermined range. Concretely, the average particle size of one thermoconductive filler A may fall from 0.01 to 0.5 µm, preferably from 0.05 to 0.5 µm; and that of the other thermoconductive filler B may fall from 0.5 to 5 µm, preferably from 0.5 to 3 µm. When the average particle sizes fall within the above-mentioned numerical ranges and when thermoconductive fillers that differ from each other are used, the packing percentage of the thermoconductive fillers in the film 2 for semiconductor back surface can be increased. Accordingly, the filler may impart excellent heat radiation capability to the film 2 for semiconductor back surface. In case where two different types of thermoconductive fillers that differ in the average particle sizes thereof are used, the blend ratio of the above-mentioned thermoconductive filler B is preferably from 30 to 90%, more preferably from 40 to 60% in terms of volume ratio, relative to the total amount of the thermoconductive filler A and the thermoconductive filler B.

The particle form of the thermoconductive filler is not specifically defined. For example, the filler particles may be spherical, oval, flattened, needle-like, fibrous, flaky, spiky or coil-like particles. Of those forms, spherical particles are preferred since the dispersibility and the packing capability of the thermoconductive filler particles in the film can be enhanced. In the invention, thermoconductive fillers that differ in the particle forms thereof may be incorporated in the film.

The film for semiconductor back surface may be a single-layer film or a multilayer film in which plural layers are laminated. In case where the film for semiconductor back surface is a multilayer film, the proportion of the thermoconductive filler may fall within the above-mentioned range relative as a whole of the entire multilayer film.

As so mentioned in the above, the thermal conductivity of the film 2 for semiconductor back surface is at least 1.5 W/mK owing to incorporation of the thermoconductive filler in the film, preferably at least 2 W/mK, more preferably at least 4 W/mK, even more preferably at least 5 W/mK. Having the thermal conductivity on the level as above, the film can efficiently release outside the heat generated by semiconductor elements.

The surface roughness (Ra) of the film 2 for semiconductor back surface before curing is not specifically defined so far as the film can secure the laser markability and the adhesiveness to semiconductor wafers and others. Preferably, the surface roughness is at most 300 nm, more preferably at most 250 nm, even more preferably at most 200 nm. When the surface roughness (Ra) of the film for semiconductor back surface is at most 300 nm, the film for semiconductor back surface can secure good adhesiveness and laser markability.

The film 2 for semiconductor back surface of this embodiment contains a resin in addition to the above-mentioned thermoconductive filler. Preferably, the film 2 for semiconductor back surface contains, as the resin, a thermosetting resin and a thermal curing-accelerating catalyst, and more preferably further contains a thermoplastic resin. By containing a thermosetting resin, the film for semiconductor back surface can effectively exhibit the function thereof as an adhesive layer.

Examples of the thermoplastic resin include natural rubber, butyl rubber, isoprene rubber, chloroprene rubber, an ethylene-vinyl acetate copolymer, an ethylene-acrylic acid copolymer, an ethylene-acrylic acid ester copolymer, a polybutadiene resin, a polycarbonate resin, a thermoplastic polyimide resin, a polyamide resin such as 6-nylon and 6,6-nylon, a phenoxy resin, an acrylic resin, a saturated polyester resin such as PET (polyethylene terephthalate) or PBT (polybutylene terephthalate), a polyamideimide resin, or a fluorine resin. The thermoplastic resin may be employed singly or in a combination of two or more kinds. Among these thermoplastic resins, an acrylic resin containing a small amount of ionic impurities, having high heat resistance and capable of securing reliability of a semiconductor element is especially preferable.

The acrylic resins are not particularly restricted, and examples thereof include polymers containing one kind or two or more kinds of esters of acrylic acid or methacrylic acid having a straight chain or branched alkyl group having 30 or less carbon atoms, preferably 4 to 18 carbon atoms, more preferably 6 to 10 carbon atoms, and especially 8 or 9 carbon atoms as component(s). Namely, in the invention, the acrylic resin has a broad meaning also including a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (lauryl group), a tridecyl group, a tetradecyl group, a stearyl group, and an octadecyl group.

Moreover, other monomers for forming the acrylic resins (monomers other than the alkyl esters of acrylic acid or methacrylic acid in which the alkyl group is one having 30 or less carbon atoms) are not particularly restricted, and examples thereof include carboxyl group-containing monomers such as acrylic acid, methacrylic acid, carboxylethyl acrylate, carboxylpentyl acrylate, itaconic acid, maleic acid, fumaric acid, and crotonic acid; acid anhydride monomers such as maleic anhydride and itaconic anhydride; hydroxyl group-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl)-methylacrylate; sulfonic acid group-containing monomers such as styrenesulfonic acid, allylsulfonic acid, 2-(meth)acrylamido-2-methylpropanesulfonic acid, (meth)acrylamidopropanesulfonic acid, sulfopropyl (meth)acrylate, and (meth)acryloyloxynaphthalenesulfonic acid; and phosphoric acid group-containing monomers such as 2-hydroxyethylacryloyl phosphate. In this regard, the (meth)acrylic acid means acrylic acid and/or methacrylic acid, (meth)acrylate means acrylate and/or methacrylate, (meth)acryl means acryl and/or methacryl, etc., which shall be applied over the whole specification.

Moreover, examples of the thermosetting resin include, in addition to an epoxy resin and a phenol resin, an amino resin, an unsaturated polyester resin, a polyurethane resin, a silicone resin and a thermosetting polyimide resin. The thermosetting resin may be employed singly or in a combination of two or more kinds. As the thermosetting resin, an epoxy resin containing only a small amount of ionic impurities which corrode a semiconductor element is suitable. Also, the phenol resin is suitably used as a curing agent of the epoxy resins.

The epoxy resin is not particularly restricted and, for example, a difunctional epoxy resin or a polyfunctional epoxy resin such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a biphenyl type epoxy resin, a naphthalene type epoxy resin, a fluorene type epoxy resin, a phenol novolak type epoxy resin, an o-cresol novolak type epoxy resin, a trishydroxyphenylmethane type epoxy resin and a tetraphenylolethane type epoxy resin, or an epoxy resin such as a hydantoin type epoxy resin, a trisglycidylisocyanurate type epoxy resin or a glycidylamine type epoxy resin may be used.

As the epoxy resin, among those exemplified above, a novolak type epoxy resin, a biphenyl type epoxy resin, a trishydroxyphenylmethane type epoxy resin, and a tetraphenylolethane type epoxy resin are preferable. This is because these epoxy resins have high reactivity with a phenol resin as a curing agent and are superior in heat resistance and the like.

Furthermore, the above-mentioned phenol resin acts as a curing agent of the epoxy resin, and examples thereof include novolak type phenol resins such as phenol novolak resins, phenol aralkyl resins, cresol novolak resins, tert-butylphenol novolak resins, and nonylphenol novolak resins; resol type phenol resins; and polyoxystyrenes such as poly-p-oxystyrene. The phenol resin may be employed singly or in a combination of two or more kinds. Among these phenol resins, phenol novolak resins and phenol aralkyl resins are especially preferable. This is because connection reliability of the semiconductor device can be improved.

The mixing ratio of the epoxy resin to the phenol resin is preferably made, for example, such that the hydroxyl group in the phenol resin becomes 0.5 to 2.0 equivalents per equivalent of the epoxy group in the epoxy resin component. It is more preferably 0.8 to 1.2 equivalents. That is, when the mixing ratio becomes outside the range, a curing reaction does not proceed sufficiently, and the characteristics of the epoxy resin cured product tends to deteriorate.

The content of the thermosetting resin is preferably from 40% by weight to 90% by weight, more preferably from 50% by weight to 90% by weight, even more preferably from 60% by weight to 90% by weight, relative to all the resin components in the film for semiconductor back surface. When the content is at least 40% by weight, then the thermosetting shrinkage may be readily controlled to be at least 2% by volume. In flip chip mounting, a mold resin to encapsulate the entire semiconductor package is not used but in general, the bump connecting part alone between the adherend and the semiconductor element is encapsulated with an encapsulating resin called an underfill material. When the film for semiconductor back surface contains the resin in the amount mentioned above, the film can be fully thermo-cured during thermal curing of the encapsulating resin, and the film can be surely adhered and fixed to the back surface of a semiconductor element to give a flip chip type semiconductor device with no film peeling therein. On the other hand, when the content is at most 90% by weight, then the film may be flexible.

Not specifically defined, the thermal curing-accelerating catalyst may be suitably selected from known thermal curing-accelerating catalysts. One or more thermal curing-accelerating catalysts may be used here either singly or as combined. As the thermal curing-accelerating catalyst, for example, an amine-based curing-accelerating catalyst, a phosphorus-based curing-accelerating catalyst, an imidazole-based curing-accelerating catalyst, a boron-based curing-accelerating catalyst, or a phosphorus-boron-based curing-accelerating catalyst can be used.

The film for semiconductor back surface is particularly suitably formed of a resin composition containing an epoxy resin and a phenolic resin or a resin composition containing an epoxy resin, a phenolic resin, and an acrylic resin. Since these resins contain only a small amount of ionic impurities and have high heat resistance, reliability of semiconductor elements can be secured.

It is important that the film for semiconductor back surface 2 has adhesiveness (close adhesiveness) to the back surface (non-circuit-formed face) of semiconductor wafer. The film for semiconductor back surface 2 can be, for example, formed of a resin composition containing an epoxy resin as a thermosetting resin component. In case where the film for semiconductor back surface 2 is cured beforehand to some degree, at its preparation, it is preferable to add a polyfunctional compound capable of reacting with the functional group or the like at the molecular chain end of the polymer as a crosslinking agent. Thereby, adhesive characteristics under high temperature can be enhanced and improvement of the heat resistance of the film can be achieved.

The adhesive force of the film for semiconductor back surface to semiconductor wafer (23° C., peeling angle of 180 degrees, peeling rate of 300 mm/min) is preferably within a range of from 0.5 N/20 mm to 15 N/20 mm, more preferably from 0.7 N/20 mm to 10 N/20 mm. When the adhesive force is at least 0.5 N/20 mm, then the film can be adhered to semiconductor wafer and semiconductor element with excellent adhesiveness and is free from film swelling or the like adhesion failure. In addition, in dicing of semiconductor wafer, the chips can be prevented from flying out. On the other hand, when the adhesive force is at most 15 N/20 mm, then it facilitates peeling from the dicing tape.

The crosslinking agent is not particularly restricted and known crosslinking agents can be used. Specifically, for example, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned. As the crosslinking agent, an isocyanate-based crosslinking agent or an epoxy-based crosslinking agent is suitable. The crosslinking agent may be employed singly or in a combination of two or more kinds.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl) isocyanurate, resorcin diglycidyl ether, and bisphenol-S-diglycidyl ether, and also epoxy-based resins having two or more epoxy groups in the molecule.

The amount of the crosslinking agent to be used is not particularly restricted and can be appropriately selected depending on the degree of the crosslinking. Specifically, it is preferable that the amount of the crosslinking agent to be used is usually 7 parts by weight or less (for example, 0.05 to 7 parts by weight) based on 100 parts by weight of the polymer component (particularly, a polymer having a functional group at the molecular chain end). When the amount of the crosslinking agent is larger than 7 parts by weight based on 100 parts by weight of the polymer component, the adhesive force is lowered, so that the case is not preferred. From the viewpoint of improving the cohesive force, the amount of the crosslinking agent is preferably 0.05 parts by weight or more based on 100 parts by weight of the polymer component.

In the invention, instead of the use of the crosslinking agent or together with the use of the crosslinking agent, it is also possible to perform a crosslinking treatment by irradiation with an electron beam, UV light, or the like.

The film for semiconductor back surface is preferably colored. Thereby, an excellent laser marking property and an excellent appearance property can be exhibited, and it becomes possible to make a semiconductor device having a value-added appearance property. As above, since the colored film for semiconductor back surface has an excellent marking property, marking can be performed to impart various kinds of information such as literal information and graphical information to the face on the non-circuit side of the semiconductor element or a semiconductor device using the semiconductor element by utilizing any of various marking methods such as a printing method and a laser marking method through the film of semiconductor back surface. Particularly, by controlling the color of coloring, it becomes possible to observe the information (for example, literal information and graphical information) imparted by marking with excellent visibility. Moreover, when the film for semiconductor back surface is colored, the dicing tape and the film for semiconductor back surface can be easily distinguished from each other, so that workability and the like can be enhanced. Furthermore, for example, as a semiconductor device, it is possible to classify products thereof by using different colors. In the case where the film for semiconductor back surface is colored (the case where the film is neither colorless nor transparent), the color shown by coloring is not particularly limited but, for example, is preferably dark color such as black, blue or red color, and black color is especially suitable.

In the present embodiment, dark color basically means a dark color having $L^*$, defined in $L^*a^*b^*$ color space, of 60 or smaller (0 to 60), preferably 50 or smaller (0 to 50), and more preferably 40 or smaller (0 to 40).

Moreover, black color basically means a black-based color having $L^*$, defined in $L^*a^*b^*$ color space, of 35 or smaller (0 to 35), preferably 30 or smaller (0 to 30), and more preferably 25 or smaller (0 to 25). In this regard, in the black color, each of $a^*$ and $b^*$, defined in the $L^*a^*b^*$ color space, can be suitably selected according to the value of $L^*$. For example, both of $a^*$ and $b^*$ are within the range of preferably −10 to 10, more preferably −5 to 5, and further preferably −3 to 3 (particularly 0 or about 0).

In the present embodiment, $L^*$, $a^*$, and $b^*$ defined in the $L^*a^*b^*$ color space can be determined by a measurement with a color difference meter (a trade name "CR-200" manufactured by Minolta Ltd; color difference meter). The $L^*a^*b^*$ color space is a color space recommended by the Commission Internationale de l'Eclairage (CIE) in 1976, and means a color space called CIE1976($L^*a^*b^*$) color space. Also, the $L^*a^*b^*$ color space is defined in Japanese Industrial Standards in JIS Z8729.

At coloring of the film for semiconductor back surface, according to an objective color, a colorant (coloring agent) can be used. As such a colorant, various dark-colored colorants such as black-colored colorants, blue-colored colorants, and red-colored colorants can be suitably used and black-colored colorants are more suitable. The colorant may be any of pigments and dyes. The colorant may be employed singly or in combination of two or more kinds. In this regard, as the dyes, it is possible to use any forms of dyes such as acid dyes, reactive dyes, direct dyes, disperse dyes, and cationic dyes. Moreover, also with regard to the pigments, the form thereof is not particularly restricted and can be suitably selected and used among known pigments.

In particular, when a dye is used as a colorant, the dye becomes in a state that it is homogeneously or almost homogeneously dispersed by dissolution in the film for semiconductor back surface, so that the film for semiconductor back surface (as a result, the dicing tape-integrated film for semiconductor back surface) having a homogeneous or almost homogeneous color density can be easily produced. Accordingly, when a dye is used as a colorant, the film for semiconductor back surface in the dicing tape-integrated film for semiconductor back surface can have a homogeneous or almost homogeneous color density and can enhance a marking property and an appearance property.

The black-colored colorant is not particularly restricted and can be, for example, suitably selected from inorganic black-colored pigments and black-colored dyes. Moreover, the black-colored colorant may be a colorant mixture in which a cyan-colored colorant (blue-green colorant), a magenta-colored colorant (red-purple colorant), and a yellow-colored colorant (yellow colorant) are mixed. The black-colored colorant may be employed singly or in a combination of two or more kinds. Of course, the black-colored colorant may be used in combination with a colorant of a color other than black.

Specific examples of the black-colored colorant include carbon black (such as furnace black, channel black, acetylene black, thermal black, or lamp black), graphite, copper oxide, manganese dioxide, azo-type pigments (such as azomethine azo black), aniline black, perylene black, titanium black, cyanine black, active charcoal, ferrite (such as non-magnetic ferrite or magnetic ferrite), magnetite, chromium oxide, iron oxide, molybdenum disulfide, a chromium complex, a composite oxide type black pigment, and an anthraquinone type organic black pigment.

In the invention, as the black-colored colorant, black-colored dyes such as C.I. Solvent Black 3, 7, 22, 27, 29, 34, 43, 70, C.I. Direct Black 17, 19, 22, 32, 38, 51, 71, C.I. Acid Black 1, 2, 24, 26, 31, 48, 52, 107, 109, 110, 119, 154, and C.I. Disperse Black 1, 3, 10, 24; black-colored pigments such as C.I. Pigment Black 1, 7; and the like can also be utilized.

As such black-colored colorants, for example, a trade name "Oil Black BY", a trade name "Oil Black BS", a trade name "Oil Black HBB", a trade name "Oil Black 803", a trade name "Oil Black 860", a trade name "Oil Black 5970", a trade name "Oil Black 5906", a trade name "Oil Black 5905" (manufactured by Orient Chemical Industries Co., Ltd.), and the like are commercially available.

Examples of colorants other than the black-colored colorant include cyan-colored colorants, magenta-colored colorants, and yellow-colored colorants. Examples of the cyan-colored colorants include cyan-colored dyes such as C.I. Solvent Blue 25, 36, 60, 70, 93, 95; C.I. Acid Blue 6 and 45; cyan-colored pigments such as C.I. Pigment Blue 1, 2, 3, 15, 15:1, 15:2, 15:3, 15:4, 15:5, 15:6, 16, 17, 17:1, 18, 22, 25, 56, 60, 63, 65, 66; C.I. Vat Blue 4, 60; and C.I. Pigment Green 7.

Moreover, among the magenta colorants, examples of magenta-colored dye include C.I. Solvent Red 1, 3, 8, 23, 24, 25, 27, 30, 49, 52, 58, 63, 81, 82, 83, 84, 100, 109, 111, 121, 122; C.I. Disperse Red 9; C.I. Solvent Violet 8, 13, 14, 21, 27; C.I. Disperse Violet 1; C.I. Basic Red 1, 2, 9, 12, 13, 14, 15, 17, 18, 22, 23, 24, 27, 29, 32, 34, 35, 36, 37, 38, 39, 40; C.I. Basic Violet 1, 3, 7, 10, 14, 15, 21, 25, 26, 27 and 28.

Among the magenta-colored colorants, examples of magenta-colored pigment include C.I. Pigment Red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, 245; C.I. Pigment Violet 3, 9, 19, 23, 31, 32, 33, 36, 38, 43, 50; C.I. Vat Red 1, 2, 10, 13, 15, 23, 29 and 35.

Moreover, examples of the yellow-colored colorants include yellow-colored dyes such as C.I. Solvent Yellow 19, 44, 77, 79, 81, 82, 93, 98, 103, 104, 112, and 162; yellow-colored pigments such as C.I. Pigment Orange 31, 43; C.I. Pigment Yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, 195; C.I. Vat Yellow 1, 3, and 20.

Various colorants such as cyan-colored colorants, magenta-colored colorants, and yellow-colorant colorants may be employed singly or in a combination of two or more kinds, respectively. In this regard, in the case where two or more kinds of various colorants such as cyan-colored colorants, magenta-colored colorants, and yellow-colorant colorants are used, the mixing ratio (or blending ratio) of these colorants is not particularly restricted and can be suitably selected according to the kind of each colorant, an objective color, and the like.

In the case where the film for semiconductor back surface 2 is colored, the colored form is not particularly restricted. The film for semiconductor back surface may be, for example, a single-layer film-shaped article added with a coloring agent. Moreover, the film may be a laminated film where a resin layer formed of at least a thermosetting resin and a coloring agent layer are at least laminated. In this regard, in the case where the film for semiconductor back surface 2 is a laminated film of the resin layer and the coloring agent layer, the film for semiconductor back surface 2 in the laminated form preferably has a laminated form of a resin layer/a coloring agent layer/a resin layer. In this case, two resin layers at both sides of the coloring agent layer may be resin layers having the same composition or may be resin layers having different composition.

Into the film for semiconductor back surface 2, other additives can be suitably blended according to the necessity. Examples of the other additives include an extender, an anti-aging agent, an antioxidant, and a surfactant, in addition to other filler (excluding thermoconductive filler), a flame retardant, a silane-coupling agent, and an ion-trapping agent.

The other filler may be any of an inorganic filler and an organic filler, but is preferably an inorganic filler. Incorporating the other filler such as an inorganic filler thereinto makes it possible to impart electroconductivity to the film for semiconductor back surface, to enhance the thermal conductivity of the film and to control the elasticity of the film. The film 2 for semiconductor back surface may be electroconductive or non-electroconductive. The inorganic filler includes various inorganic powders of, for example, ceramics such as silica, clay, gypsum, calcium carbonate, barium sulfate, beryllium oxide; metals such as aluminium, copper, silver, gold, nickel, chromium, lead, tin, zinc, palladium, solder; their alloys and other carbon. One or more such fillers may be used here either singly or as combined. As the filler, preferred is silica, and more preferred is fused silica. Preferably, the average particle size of the inorganic filler is within a range of from 0.1 µm to 80 µm. The average particle size of the inorganic filler is determined with a laser diffraction particle sizer.

The blending amount of the above-mentioned other filler (in particular, inorganic filler) is preferably 80 parts by weight or less (0 part by weight to 80 parts by weight) and more preferably 0 part by weight to 70 parts by weight based on 100 parts by weight of the organic resin components.

Examples of the flame retardant include antimony trioxide, antimony pentoxide, and brominated epoxy resins. The flame retardant may be employed singly or in a combination of two or more kinds. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. The silane coupling agent may be employed singly or in a combination of two or more kinds. Examples of the ion-trapping agent include hydrotalcites and bismuth hydroxide. The ion-trapping agent may be employed singly or in a combination of two or more kinds.

The film for semiconductor back surface 2 can be, for example, formed by utilizing a commonly used method including mixing a thermosetting resin such as an epoxy resin and, if necessary, a thermoplastic resin such as an acrylic resin and optional solvent and other additives to prepare a resin composition, followed by forming it to a film-shaped layer. Specifically, a film-shaped layer (adhesive layer) as the film for semiconductor back surface can be formed, for example, by a method including applying the resin composition on the pressure-sensitive adhesive layer 32 of the dicing tape; a method including applying the resin composition on an appropriate separator (such as release paper) to form a resin layer (or an adhesive layer) and then transferring (transcribing) it on the pressure-sensitive adhesive layer 32; or the like. In this regard, the resin composition may be a solution or a dispersion.

Incidentally, in the case where the film for semiconductor back surface 2 is formed of a resin composition containing a thermosetting resin such as an epoxy resin, the film for semiconductor back surface is in a state that the thermosetting resin is uncured or partially cured at a stage before the film is applied to a semiconductor wafer. In this case, after it is applied to the semiconductor wafer (specifically, usually, at the time when the encapsulating material is cured in the flip chip bonding step), the thermosetting resin in the film for semiconductor back surface is completely or almost completely cured.

As above, since the film for semiconductor back surface is in a state that the thermosetting resin is uncured or partially cured even when the film contains the thermosetting resin, the gel fraction of the film for semiconductor back surface is not particularly restricted but is, for example, suitably selected from the range of 50% by weight or less (0 to 50% by weight) and is preferably 30% by weight or less (0 to 30% by weight) and particularly preferably 10% by weight or less (0 to 10% by weight). The gel fraction of the film for semiconductor back surface can be measured by the following measuring method.

<Gel Fraction Measuring Method>

About 0.1 g of a sample is sampled from the film for semiconductor back surface 2 and precisely weighed (weight of sample) and, after the sample is wrapped in a mesh-type sheet, it is immersed in about 50 mL of toluene at room temperature for 1 week. Thereafter, a solvent-insoluble matter (content in the mesh-type sheet) is taken out of the toluene and dried at 130° C. for about 2 hours, the solvent-insoluble matter after drying is weighed (weight after immersion and drying), and a gel fraction (% by weight) is then calculated according to the following expression (a).

$$\text{Gel fraction (\% by weight)} = [(\text{Weight after immersion and Drying})/(\text{Weight of sample})] \times 100 \quad (a)$$

The gel fraction of the film for semiconductor back surface can be controlled by the kind and content of the resin components and the kind and content of the crosslinking agent and besides, heating temperature, heating time and the like.

In the invention, in the case where the film for semiconductor back surface is a film-shaped article formed of a resin composition containing a thermosetting resin such as an epoxy resin, close adhesiveness to a semiconductor wafer can be effectively exhibited.

Incidentally, since cutting water is used in the dicing step of the semiconductor wafer, the film for semiconductor back surface absorbs moisture to have a moisture content of a normal state or more in some cases. When flip chip bonding is performed with still maintaining such a high moisture content, water vapor remains at the adhesion interface between the film for semiconductor back surface and the semiconductor wafer or its processed body (semiconductor) and lifting is generated in some cases. Therefore, by constituting the film for semiconductor back surface as a configuration in which a core material having a high moisture permeability is provided on each surface thereof, water vapor diffuses and thus it becomes possible to avoid such a problem. From such a viewpoint, a multilayered structure in which the film for semiconductor back surface is formed at one surface or both surfaces of the core material may be used as the film for semiconductor back surface. Examples of the core material include films (e.g., polyimide films, polyester films, polyethylene terephthalate films, polyethylene naphthalate films, polycarbonate films, etc.), resin substrates reinforced with a glass fiber or a plastic nonwoven fiber, silicon substrates, and glass substrates.

The thickness (total thickness in the case of the laminated film) of the film for semiconductor back surface 2 is not particularly restricted but can be, for example, suitably selected from the range of about 2 μm to 200 μm. Furthermore, the thickness is preferably about 3 μm to 160 μm, more preferably about 4 μm to 100 μm, and particularly about 5 μm to 80 μm.

The tensile storage elastic modulus of the film for semiconductor back surface 2 in an uncured state at 23° C. is preferably 1 GPa or more (e.g., 1 GPa to 50 GPa), more preferably 2 GPa or more, and particularly, 3 GPa or more is suitable. When the tensile storage elastic modulus is 1 GPa or more, the attachment of the film for semiconductor back surface to a support can be effectively suppressed or prevented at the time when the film for semiconductor back surface 2 is placed on the support and transportation and the like are performed after the semiconductor chip is peeled from the pressure-sensitive adhesive layer 32 of the dicing tape together with the film for semiconductor back surface 2. In this regard, the support is, for example, a top tape, a bottom tape, and the like in a carrier tape. In the case where the film for semiconductor back surface 2 is formed of a resin composition containing a thermosetting resin, as mentioned above, the thermosetting resin is usually in a uncured or partially cured state, so that the tensile storage elastic modulus of the film for semiconductor back surface at 23° C. is a tensile storage elastic modulus at 23° C. in a state that the thermosetting resin is uncured or partially cured.

Here, the film for semiconductor back surface 2 may be either a single layer or a laminated film where a plurality of layers are laminated. In the case of the laminated film, the tensile storage elastic modulus is sufficiently 1 GPa or more (e.g., 1 GPa to 50 GPa) as the whole laminated film in an uncured state. Also the tensile storage elastic modulus (23° C.) of the film for semiconductor back surface in an uncured state can be controlled by suitably setting up the kind and content of the resin components (thermoplastic resin and/or thermosetting resin) or the kind and content of a filler such as a silica filler. In the case where the film for semiconductor back surface 2 is a laminated film where a plurality of layers are laminated (in the case where the film for semiconductor back surface has a form of the laminated layer), as the laminated layer form, for example, a laminated form composed of a wafer adhesive layer and a laser marking layer can be exemplified. Moreover, between the wafer adhesive layer and the laser marking layer, other layers (an intermediate layer, a light-shielding layer, a reinforcing layer, a colored layer, a base material layer, an electromagnetic wave-shielding layer, a heat conductive layer, a pressure-sensitive adhesive layer, etc.) may be provided. In this regard, the wafer adhesive layer is a layer which exhibits an excellent close adhesiveness (adhesive property) to a wafer and a layer which comes into contact with the back surface of a wafer. On the other hand, the laser marking layer is a layer which exhibits an excellent laser marking property and a layer which is utilized at the laser marking on the back surface of a semiconductor chip.

The tensile storage elastic modulus is determined by preparing the film for semiconductor back surface 2 in an uncured state without lamination onto the dicing tape 3 and measuring elastic modulus in a tensile mode under conditions of a sample width of 10 mm, a sample length of 22.5 mm, a sample thickness of 0.2 mm, a frequency of 1 Hz, and a temperature elevating rate of 10° C./minute under a nitrogen atmosphere at a prescribed temperature (23° C.) using a dynamic viscoelasticity measuring apparatus "Solid Analyzer RS A2" manufactured by Rheometrics Co. Ltd. and the measured elastic modulus is regarded as a value of tensile storage elastic modulus obtained.

Preferably, the film for semiconductor back surface 2 is protected with a separator (release liner) on at least one surface thereof (not shown in figures). For example, in the dicing tape-integrated film for semiconductor back surface 1, a separator may be provided on at least one surface of the film for semiconductor back surface. On the other hand, in the film for semiconductor back surface not integrated with a dicing tape, a separator may be provided on one surface or both surfaces of the film for semiconductor back surface. The separator has a function as a protective material for protecting the film for semiconductor back surface until it is practically used. Further, in the dicing tape-integrated film for semiconductor back surface 1, the separator may further serve as the supporting base material in transferring the film for semiconductor back surface 2 onto the pressure-sensitive adhesive layer 32 of the base material of the dicing tape. The separator is peeled off when a semiconductor wafer is attached onto the film for semiconductor back surface. As the separator, a film of polyethylene or polypropylene, as well as a plastic film (such as polyethylene terephthalate), a paper or the like whose surface is coated with a releasing agent such as a fluorine-based releasing agent or a long-chain alkyl acrylate-based releasing agent can also be used. The separator can be formed by a conventionally known method. Moreover, the thickness or the like of the separator is not particularly restricted.

In case where the film for semiconductor back surface 2 is not laminated with the dicing tape 3, the film for semiconductor back surface 2 may be wound up along with one separator having a release layer on both sides thereof, into a roll in which the film 2 is protected with the separator having a release layer on both surfaces thereof, or the film 2 may be protected with a separator having a release layer on at least one surface thereof.

Moreover, the light transmittance with a visible light (visible light transmittance, wavelength: 400 to 800 nm) in the film for semiconductor back surface 2 is not particularly restricted but is, for example, preferably in the range of 20% or less (0 to 20%), more preferably 10% or less (0 to 10%), and particularly preferably 5% or less (0 to 5%). When the film for semiconductor back surface 2 has a visible light transmittance of more than 20%, there is a concern that the transmission of the light may adversely influence the semiconductor element. The visible light transmittance (%) can be controlled by the kind and content of the resin components of the film for semiconductor back surface 2, the kind and content of the coloring agent (such as pigment or dye), the content of the inorganic filer, and the like.

The visible light transmittance (%) of the film for semiconductor back surface 2 can be determined as follows. Namely, a film for semiconductor back surface 2 having a thickness (average thickness) of 20 μm itself is prepared. Then, the film for semiconductor back surface 2 is irradiated with a visible light having a wavelength of 400 to 800 nm in a prescribed intensity [apparatus: a visible light generating apparatus manufactured by Shimadzu Corporation [trade name "ABSORPTION SPECTRO PHOTOMETER"], and the intensity of transmitted visible light is measured. Further, the visible light transmittance (%) can be determined based on intensity change before and after the transmittance of the visible light through the film for semiconductor back surface 2. In this regard, it is also possible to derive visible light transmittance (%; wavelength: 400 to 800 nm) of the film for semiconductor back surface 2 having a thickness of 20 μm from the value of the visible light transmittance (%; wavelength: 400 to 800 nm) of the film for semiconductor back surface 2 whose thickness is not 20 μm. In the invention, the visible light transmittance (%) is determined in the case of the film for semiconductor back surface 2 having a thickness of 20 μm, but the film for semiconductor back surface according to the invention is not limited to one having a thickness of 20 μm.

Moreover, as the film for semiconductor back surface 2, one having lower moisture absorbance is more preferred. Specifically, the moisture absorbance is preferably 1% by weight or less and more preferably 0.8% by weight or less. By regulating the moisture absorbance to 1% by weight or less, the laser marking property can be enhanced. Moreover, for example, the generation of voids between the film for semiconductor back surface 2 and the semiconductor element can be suppressed or prevented in the reflow step. The moisture absorbance is a value calculated from a weight change before and after the film for semiconductor back surface 2 is allowed to stand under an atmosphere of a temperature of 85° C. and a humidity of 85% RH for 168 hours. In the case where the film for semiconductor back surface 2 is formed of a resin composition containing a thermosetting resin, the moisture absorbance means a value obtained when the film after thermal curing is allowed to stand under an atmosphere of a temperature of 85° C. and a humidity of 85% RH for 168 hours. Moreover, the moisture absorbance can be regulated, for example, by changing the amount of the inorganic filler to be added.

Moreover, as the film for semiconductor back surface 2, one having a smaller ratio of volatile matter is more preferred. Specifically, the ratio of weight decrease (weight decrease ratio) of the film for semiconductor back surface 2 after heating treatment is preferably 1% by weight or less and more preferably 0.8% by weight or less. The conditions for the heating treatment are a heating temperature of 250° C. and a heating time of 1 hour. By regulating the weight decrease ratio to 1% by weight or less, the laser marking property can be enhanced. Moreover, for example, the generation of cracks in a flip chip type semiconductor device can be suppressed or prevented in the reflow step. The weight decrease ratio can be regulated, for example, by adding an inorganic substance capable of reducing the crack generation at lead-free solder reflow. In the case where the film for semiconductor back surface 2 is formed of a resin composition containing a thermosetting resin component, the weight decrease ratio is a value obtained when the film for semiconductor back surface after thermal curing is heated under conditions of a temperature of 250° C. and a heating time of 1 hour.

(Dicing Tape)

The dicing tape 3 includes a base material 31 and a pressure-sensitive adhesive layer 32 formed on the base material 31. Thus, it is sufficient that the dicing tape 3 has a configuration in which the base material 31 and the pressure-sensitive adhesive layer 32 are laminated. The base material (supporting base material) can be used as a supporting material for the pressure-sensitive adhesive layer and the like. The base material 31 preferably has a radiation ray-transmitting property. As the base material 31, for example, suitable thin materials, e.g., paper-based base materials such as paper; fiber-based base materials such as fabrics, non-woven fabrics, felts, and nets; metal-based base materials such as metal foils and metal plates; plastic base materials such as plastic films and sheets; rubber-based base materials such as rubber sheets; foamed bodies such as foamed sheets; and laminates thereof [particularly, laminates of plastic based materials with other base materials, laminates of plastic films (or sheets) each other, etc.] can be used. In the invention, as the base material, plastic base materials such as plastic films and sheets can be suitably employed. Examples of raw materials for such plastic materials include olefinic resins such as polyethylene (PE), polypropylene (PP), and ethylene-propylene copolymers; copolymers using ethylene as a monomer component, such as ethylene-vinyl acetate copolymers (EVA), ionomer resins, ethylene-(meth)acrylic acid copolymers, and ethylene-(meth)acrylic acid ester (random, alternating) copolymers; polyesters such as polyethylene terephthalate (PET), polyethylene naphthalate (PEN), and polybutylene terephthalate (PBT); acrylic resins; polyvinyl chloride (PVC); polyurethanes; polycarbonates; polyphenylene sulfide (PPS); amide-based resins such as polyamides (Nylon) and whole aromatic polyamides (aramide); polyether ether ketones (PEEK); polyimides; polyetherimides; polyvinylidene chloride; ABS (acrylonitrile-butadiene-styrene copolymers); cellulose-based resins; silicone resins; and fluorinated resins.

In addition, the materials for the base material 31 include polymers such as crosslinked materials of the foregoing resins. The plastic films may be used without stretching or may be used after subjected to a uniaxial or biaxial stretching treatment, if necessary. According to the resin sheet to which thermal contraction property is imparted by a stretching treatment or the like, the adhered area between the pressure-sensitive adhesive layer 32 and the film for semiconductor back surface 2 is reduced by thermal contraction of the base material 31 after dicing and thus the recovery of the semiconductor chip can be facilitated.

A commonly used surface treatment, e.g., a chemical or physical treatment such as a chromate treatment, ozone exposure, flame exposure, exposure to high-voltage electric shock, or an ionized radiation treatment, or a coating treatment with an undercoating agent e.g., a pressure-sensitive adhesive substance to be mentioned later) may be applied onto the surface of the base material 31 in order to enhance close adhesiveness with the adjacent layer, holding properties, and the like.

As the base material 31, the same kind or different kinds of materials can be suitably selected and used and, if necessary, several kinds of materials can be blended and used. Moreover, to the base material 31, for imparting antistatic ability, a vapor deposition layer of a conductive substance having a thickness of about 30 to 500 angstrom, which is composed of a metal, alloy or an oxide thereof, can be formed on the base material 31. The base material 31 may be a single layer or a multilayer of two or more thereof.

The thickness (total thickness in the case of the laminated layer) of the base material 31 is not particularly restricted and can be appropriately selected depending on strength, flexibility, intended purpose of use, and the like. For example, the thickness is generally 1,000 μm or less (e.g., 1 μm to 1,000 μm), preferably 10 μm to 500 μm, further preferably 20 μm to 300 μm, and particularly preferably about 30 μm to 200 μm but is not limited thereto.

Incidentally, the base material 31 may contain various additives (a coloring agent, a filler, a plasticizer, an antiaging agent, an antioxidant, a surfactant, a flame retardant, etc.) within the range where the advantages and the like of the invention are not impaired.

(Pressure-Sensitive Adhesive Layer)

The pressure-sensitive adhesive layer 32 is formed of a pressure-sensitive adhesive and has an pressure-sensitive adhesiveness. Not specifically defined, the pressure-sensitive adhesive may be suitably selected from known pressure-sensitive adhesives. Concretely, as the pressure-sensitive adhesive, for example, those having the above-mentioned characteristics are suitably selected from known pressure-sensitive adhesives such as acrylic pressure-sensitive adhesives, rubber-based pressure-sensitive adhesives, vinyl alkyl ether-based pressure-sensitive adhesives, silicone-based pressure-sensitive adhesives, polyester-based pressure-sensitive adhesives, polyamide-based pressure-sensitive adhesives, urethane-based pressure-sensitive adhesives, fluorine-based pressure-sensitive adhesives, styrene-diene block copolymer-based pressure-sensitive adhesives, and creep characteristics-improved pressure-sensitive adhesives prepared by incorporating a thermofusible resin having a melting point of not higher than 200° C. to the above-mentioned pressure-sensitive adhesive (for example, see JP-A 56-61468, JP-A-61-174857, JP-A-63-17981, JP-A-56-13040, herein incorporated by reference), and are used herein. As the pressure-sensitive adhesive, also usable here are radiation-curable pressure-sensitive adhesives (or energy ray-curable pressure-sensitive adhesives) and thermally expandable pressure-sensitive adhesives. One or more such pressure-sensitive adhesives may be used here either singly or as combined.

As the pressure-sensitive adhesive, preferred for use herein are acrylic pressure-sensitive adhesives and rubber-based pressure-sensitive adhesives, and more preferred are acrylic pressure-sensitive adhesives. The acrylic pressure-sensitive adhesives include those comprising, as the base polymer, an acrylic polymer (homopolymer or copolymer) of one or more alkyl (meth)acrylates as monomer component(s).

The alkyl (meth)acrylate for the acrylic pressure-sensitive adhesive includes, for example, methyl (meth)acrylate, ethyl (meth)acrylate, propyl (meth)acrylate, isopropyl (meth)acrylate, butyl (meth)acrylate, isobutyl (meth)acrylate, s-butyl (meth)acrylate, t-butyl (meth)acrylate, pentyl (meth)acrylate, hexyl (meth)acrylate, heptyl (meth)acrylate, octyl (meth)acrylate, 2-ethylhexyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, eicosyl (meth)acrylate, etc. As the alkyl (meth)acrylate, preferred are those in which the alkyl group has from 4 to 18 carbon atoms. In the alkyl (meth)acrylate, the alkyl group may be linear or branched.

The acrylic polymer may contain, if desired, a unit corresponding to any other monomer component copolymerizable with the above-mentioned alkyl (meth)acrylate (copolymerizable monomer component), for the purpose of improving the cohesive force, the heat resistance and the crosslinkability thereof. The copolymerizable monomer component includes, for example, carboxyl group-containing monomers such as (meth)acrylic acid (acrylic acid, methacrylic acid), carboxyethyl acrylate, carboxypentyl acrylate, itaconic acid, maleic acid, fumaric acid, crotonic acid; acid anhydride group-containing monomers such as maleic anhydride, itaconic anhydride; hydroxyl group-containing monomers such as hydroxyethyl (meth)acrylate, hydroxypropyl (meth)acrylate, hydroxybutyl (meth)acrylate, hydroxyhexyl (meth)acrylate, hydroxyoctyl (meth)acrylate, hydroxydecyl (meth)acrylate, hydroxylauryl (meth)acrylate, (4-hydroxymethylcyclohexyl) methyl methacrylate; sulfonic acid group-containing monomers such as styrenesulfonic acid, allylsulfonic acid, 2-(meth)acrylamide-2-methylpropanesulfonic acid, (meth)acrylamide-propanesulfonic acid, sulfopropyl (meth)acrylate, (meth)acryloyloxynaphthalenesulfonic acid; phosphoric acid group-containing monomers such as 2-hydroxyethyl acryloylphosphate; (N-substituted) amide monomers such as (meth)acrylamide, N,N-dimethyl(meth)acrylamide, N-butyl (meth)acrylamide, N-methylol(meth)acrylamide, N-methylolpropane(meth)acrylamide; aminoalkyl (meth)acrylate monomers such as aminoethyl (meth)acrylate, N,N-dimethylaminoethyl (meth)acrylate, t-butylaminoethyl (meth)acrylate; alkoxyalkyl (meth)acrylate monomers such as methoxyethyl (meth)acrylate, ethoxyethyl (meth)acrylate; cyanoacrylate monomers such as acrylonitrile, methacrylonitrile; epoxy group-containing acrylic monomers such as glycidyl (meth)acrylate; styrene monomers such as styrene, α-methylstyrene; vinyl ester monomers such as vinyl acetate, vinyl propionate; olefin monomers such as isoprene, butadiene, isobutylene; vinyl ether monomers such as vinyl ether; nitrogen-containing monomers such as N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarbonamides, N-vinylcaprolactam; maleimide monomers such as N-cyclohexylmaleimide, N-isopropylmaleimide, N-laurylmaleimide, N-phenylmaleimide; itaconimide monomers such as N-methylitaconimide, N-ethylitaconimide, N-butylitaconimide, N-octylitaconimide, N-2-ethylhexylitaconimide, N-cyclohexylitaconimide, N-laurylitaconimide; succinimide monomers such as N-(meth)acryloyloxymethylenesuccinimide, N-(meth)acryloyl-6-oxyhexamethylenesuccinimide, N-(meth)acryloyl-8-oxyoctamethylenesuccinimide; acryl glycolate monomers such as polyethylene glycol (meth)acrylate, polypropylene glycol (meth)acrylate, methoxyethylene glycol (meth)acrylate, methoxypolypropylene glycol (meth)acrylate; acrylate monomers having a hetero ring, a halogen atom, a silicone atom or the like such as tetrahydrofurfuryl (meth)acrylate, fluoro(meth)acrylate, silicone (meth)acrylate; polyfunctional monomers such as hexanediol di(meth)acrylate, (poly)ethylene glycol di(meth)acrylate, (poly)propylene glycol di(meth)acrylate, neopentylglycol di(meth)acrylate, pentaerythritol di(meth)acrylate, trimethylolpropane tri(meth)acrylate, pentaerythritol tri(meth)acrylate, dipentaerythritol hexa(meth)acrylate, epoxyacrylate, polyester acrylate, urethane acrylate, divinylbenzene, butyl di(meth)acrylate, hexyl di(meth)acrylate, etc. One or more these copolymerizable monomer components may be used here either singly or as combined.

The radiation-curable pressure-sensitive adhesive (or energy ray-curable pressure-sensitive adhesive) (composition) usable in the invention includes, for example, an internal-type radiation-curable pressure-sensitive adhesive comprising, as the base polymer, a polymer having a radical-reactive carbon-carbon double bond in the polymer side chain, main chain or main chain terminal, and a radiation-curable pressure-sensitive adhesive prepared by incorporating a UV-curable monomer component or oligomer component in a pressure-sensitive adhesive. The thermally expandable pressure-sensitive adhesive also usable here includes, for example, those comprising a pressure-sensitive adhesive and a foaming agent (especially thermally expandable microspheres).

In the invention, the pressure-sensitive adhesive layer 32 may contain various additives (e.g., a tackifying resin, a coloring agent, a thickener, an extender, a filler, a plasticizer, an antiaging agent, an antioxidant, a surfactant, a crosslinking agent, etc.) within the range where the advantages of the invention are not impaired.

The crosslinking agent is not particularly restricted and known crosslinking agents can be used. Specifically, as the crosslinking agent, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned, and isocyanate-based crosslinking agents and epoxy-based crosslinking agents are suitable. The crosslinking agent may be employed singly or in a combination of two or more kinds. Incidentally, the amount of the crosslinking agent to be used is not particularly restricted.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidy-laminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl) isocyanurate, resorcin diglycidyl ether, and bisphenol-S-diglycidyl ether, and also epoxy-based resins having two or more epoxy groups in the molecule.

In place of using the crosslinking agent or along with the crosslinking agent in the invention, the pressure-sensitive adhesive layer may be crosslinked through irradiation with electron rays or UV rays.

The pressure-sensitive adhesive layer 32 can be, for example, formed by utilizing a commonly used method including mixing a pressure-sensitive adhesive and optional solvent and other additives and then shaping the mixture into a sheet-like layer. Specifically, for example, there may be mentioned a method including applying a mixture containing a pressure-sensitive adhesive and optional solvent and other additives on the base material 31; a method including applying the foregoing mixture on an appropriate separator (such as a release paper) to form a pressure-sensitive adhesive layer 32 and then transferring (transcribing) it on the base material 31; or the like.

Not specifically defined, the thickness of the pressure-sensitive adhesive layer 32 is, for example, from 5 μm to 300 μm (preferably from 5 μm to 200 μm, more preferably from 5 μm to 100 μm, even more preferably from 7 μm to 50 μm) or so. When the thickness of the pressure-sensitive adhesive layer 32 falls within the above range, then the layer may exhibit suitable pressure-sensitive adhesive force. The pressure-sensitive adhesive layer 32 may be either a single layer or a multilayer.

The adhesive force of the pressure-sensitive adhesive layer 32 of the dicing tape 3 to the film for flip chip type semiconductor back surface 2 (23° C., peeling angle of 180 degrees, peeling rate of 300 mm/min) is preferably within a range of from 0.02 N/20 mm to 10 N/20 mm, more preferably from 0.05 N/20 mm to 5 N/20 mm. When the adhesive force is at least 0.02 N/20 mm, then the semiconductor chips may be prevented from flying away in dicing semiconductor wafer. On the other hand, when the adhesive force is at most 10 N/20 mm, then it facilitates peeling of semiconductor chips in picking up them, and prevents the pressure-sensitive adhesive from remaining.

Incidentally, in the invention, the film for flip-chip type semiconductor back surface 2 or the dicing tape-integrated film for semiconductor back surface 1 can be made to have an antistatic function. Owing to this configuration, the circuit can be prevented from breaking down due to the generation of electrostatic energy at the time adhesion and at the time of peeling thereof or due to charging of a semiconductor wafer or the like by the electrostatic energy. Imparting of the antistatic function can be performed by an appropriate manner such as a method of adding an antistatic agent or a conductive substance to the base material 31, the pressure-sensitive adhesive layer 32, and the film for semiconductor back surface 2, or a method of providing a conductive layer composed of a charge-transfer complex, a metal film, or the like onto the base material 31. As these methods, a method in which an impurity ion having a fear of changing quality of the semiconductor wafer is difficult to generate is preferable. Examples of the conductive substance (conductive filler) to be blended for the purpose of imparting conductivity, improving thermal conductivity, and the like include a sphere-shaped, a needle-shaped, or a flake-shaped metal powder of silver, aluminum, gold, copper, nickel, a conductive alloy, or the like; a metal oxide such as alumina; amorphous carbon black, and graphite. However, the film for semiconductor back surface 2 is preferably non-conductive from the viewpoint of having no electric leakage.

Moreover, the film for flip-chip type semiconductor back surface 2 or the dicing tape-integrated film for semiconductor back surface 1 may be formed in a form where it is wound as a roll or may be formed in a form where the sheet (film) is laminated. For example, in the case where the film has the form where it is wound as a roll, the film is wound as a roll in a state that the film for semiconductor back surface 2 or the laminate of the film for semiconductor back surface 2 and the dicing tape 3 is protected by a separator according to needs, whereby the film can be prepared as a film for semiconductor back surface 2 or a dicing tape-integrated film for semiconductor back surface 1 in a state or form where it is wound as a roll. In this regard, the dicing tape-integrated film for semiconductor back surface 1 in the state or form where it is wound as a roll may be constituted by the base material 31, the pressure-sensitive adhesive layer 32 formed on one surface of the base material 31, the film for semiconductor back surface 2 formed on the pressure-sensitive adhesive layer 32, and a releasably treated layer (rear surface treated layer) formed on the other surface of the base material 31.

Incidentally, the thickness of the dicing tape-integrated film for semiconductor back surface 1 (total thickness of the thickness of the film for semiconductor back surface and the thickness of the dicing tape including the base material 31 and the pressure-sensitive adhesive layer 32) can be, for example, selected from the range of 8 μm to 1,500 μm, and it is preferably from 20 μm to 850 μm, more preferably 31 μm to 500 μm, and particularly preferably 47 μm to 330 μm.

In this regard, in the dicing tape-integrated film for semiconductor back surface 1, by controlling the ratio of the thickness of the film for semiconductor back surface 2 to the thickness of the pressure-sensitive adhesive layer 32 of the dicing tape 3 or the ratio of the thickness of the film for semiconductor back surface 2 to the thickness of the dicing tape (total thickness of the base material 31 and the pressure-sensitive adhesive layer 32), a dicing property at the dicing step, a picking-up property at the picking-up step, and the like can be improved and the dicing tape-integrated film for semiconductor back surface 1 can be effectively utilized from the dicing step of the semiconductor wafer to the flip chip bonding step of the semiconductor chip.

(Producing Method of Dicing Tape-Integrated Film for Semiconductor Back Surface)

The producing method of the dicing tape-integrated film for semiconductor back surface according to the present embodiment is described while using the dicing tape-integrated film for semiconductor back surface 1 shown in FIG. 1 as an example. First, the base material 31 can be formed by a conventionally known film-forming method. Examples of the film-forming method include a calendar film-forming method, a casting method in an organic solvent, an inflation extrusion method in a closely sealed system, a T-die extrusion method, a co-extrusion method, and a dry laminating method.

Next, the pressure-sensitive adhesive composition is applied to the base material 31 and dried thereon (and optionally crosslinked under heat) to form the pressure-sensitive adhesive layer 32. The coating system includes roll coating, screen coating, gravure coating, etc. The pressure-sensitive adhesive layer composition may be directly applied to the base material 31 to form the pressure-sensitive adhesive layer 32 on the base material 31; or the pressure-sensitive adhesive composition may be applied to a release sheet or the like of which the surface has been processed for lubrication, to form the pressure-sensitive adhesive layer 32 thereon, and the pressure-sensitive adhesive layer 32 may be transferred onto the base material 31. With that, the dicing tape 3 is formed having the pressure-sensitive adhesive layer 32 formed on the base material 31.

On the other hand, a forming material for forming the film for semiconductor back surface 2 is applied onto a release sheet to form a coating layer having a predetermined thickness after dried, and then dried under a predetermined condition (optionally heated in case where thermal curing is necessary, and dried) to form the coating layer. The coating layer is transferred onto the pressure-sensitive adhesive layer 32 to thereby form the film for semiconductor back surface 2 on the pressure-sensitive adhesive layer 32. The film for semiconductor back surface 2 may also be formed on the pressure-sensitive adhesive layer 32 by directly applying the forming material for forming the film for semiconductor back surface 2 onto the pressure-sensitive adhesive layer 32 and then drying it under a predetermined condition (optionally heating it in case where thermal curing is necessary, and drying it). According to the process as above, the dicing tape-integrated film for semiconductor back surface 1 of the invention can be obtained. In case where thermal curing is needed in forming the film for semiconductor back surface 2, it is important that the thermal curing is effected to such a degree that the coating layer could be partially cured, but preferably, the coating layer is not thermally cured.

The dicing tape-integrated film for semiconductor back surface 1 of the invention can be suitably used at the production of a semiconductor device including the flip chip connection step. Namely, the dicing tape-integrated film for semiconductor back surface 1 of the invention is used at the production of a flip chip-mounted semiconductor device and thus the flip chip-mounted semiconductor device is produced in a condition or form where the film for semiconductor back surface 2 of the dicing tape-integrated film for semiconductor back surface 1 is attached to the back surface of the semiconductor chip. Therefore, the dicing tape-integrated film for semiconductor back surface 1 of the invention can be used for a flip chip-mounted semiconductor device (a semiconductor device in a state or form where the semiconductor chip is fixed to an adherend such as a substrate by a flip chip bonding method).

The film for semiconductor back surface 2 is usable also for flip chip-mounted semiconductor devices (semiconductor devices in a state or form where a semiconductor chip is fixed to the adherend such as a substrate or the like in a flip chip bonding method), like in the dicing tape-integrated film for semiconductor back surface 1.

(Semiconductor Wafer)

The semiconductor wafer is not particularly restricted as long as it is a known or commonly used semiconductor wafer and can be appropriately selected and used among semiconductor wafers made of various materials. In the invention, as the semiconductor wafer, a silicon wafer can be suitable used.

(Production Process of Semiconductor Device)

The process for producing a semiconductor device according to the invention will be described referring to FIGS. 2A to 2D. FIGS. 2A to 2D are cross-sectional schematic views showing a process for producing a semiconductor device in the case where a dicing tape-integrated film for semiconductor back surface 1 is used.

According to the semiconductor device production method of the invention, the dicing tape-integrated film 1 for semiconductor back surface is used to produce a semiconductor device. Concretely, the method comprises a step of attaching a semiconductor wafer onto the dicing tape-integrated film for semiconductor back surface, a step of dicing the semiconductor wafer, a step of picking up the semiconductor element obtained by dicing, and a step of flip chip-connecting the semiconductor element onto an adherend.

Incidentally, when using the film 2 for semiconductor back surface, a semiconductor device can also be produced according to the semiconductor device production method of using the dicing tape-integrated film 1 for semiconductor back surface. For example, the film 2 for semiconductor back surface is attached to and integrated with a dicing tape to prepare a dicing tape-integrated film for semiconductor back surface, and a semiconductor device can be produced using the dicing tape-integrated film. In this case, the semiconductor device production method of using the film 2 for semiconductor back surface comprises the steps constituting the semiconductor device production method of using a dicing tape-integrated film for semiconductor back surface mentioned above, and, as combined therewith, an additional step of attaching a film for semiconductor back surface and a dicing tape in such a manner that the film for semiconductor back surface could be in contact with the pressure-sensitive adhesive layer of the dicing tape.

Alternatively, the film 2 for semiconductor back surface may be used by being directly attached to a semiconductor wafer without integrated with a dicing tape. In this case, the semiconductor device production method of using the film 2 for semiconductor back surface comprises a step of attaching a film for semiconductor back surface to a semiconductor wafer followed by a step of attaching a dicing tape to the film for semiconductor back surface with the semiconductor wafer attached thereto, in such a manner that the film for semiconductor back surface could be in contact with the pressure-sensitive adhesive layer of the dicing tape, in place of the step of attaching a semiconductor wafer onto a dicing tape-integrated film for semiconductor back surface in the semiconductor device production method of using a dicing tape-integrated film for semiconductor back surface mentioned above.

In another application embodiment thereof, the film 2 for semiconductor back surface may be directly attached to the semiconductor chip prepared by dicing a semiconductor wafer into individual semiconductor chips. In this case, the semiconductor device production method of using the film 2 for semiconductor back surface comprises, for example, at least a step of attaching a dicing tape to a semiconductor wafer, a step of dicing the semiconductor wafer, a step of picking up the semiconductor element obtained by the dicing, a step of flip chip-connecting the semiconductor element onto an adherend, and a step of attaching a film for semiconductor back surface to the semiconductor element.

(Mounting Step)

Figure 2A:
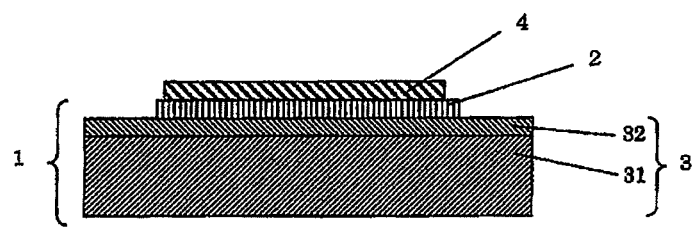
FIGS. 2A to 2D are cross-sectional schematic views showing one embodiment of a process for producing a semiconductor device using a dicing tape-integrated film for semiconductor back surface of the invention.

First, as shown in FIG. 2A, a separator optionally provided on the film for semiconductor back surface 2 of the dicing tape-integrated film for semiconductor back surface 1 is suitably peeled off and the semiconductor wafer 4 is attached onto the film for semiconductor back surface 2 to be fixed by adhesion and holding (mounting step). On this occasion, the film for semiconductor back surface 2 is in an uncured state (including a semi-cured state). Moreover, the dicing tape-integrated film for semiconductor back surface 1 is attached to the back surface of the semiconductor wafer 4. The back surface of the semiconductor wafer 4 means a face opposite to the circuit face (also referred to as non-circuit face, non-electrode-formed face, etc.). The attaching method is not particularly restricted but a method by press bonding is preferred. The press bonding is usually performed while pressing with a pressing means such as a pressing roll.

(Dicing Step)

Figure 2B:
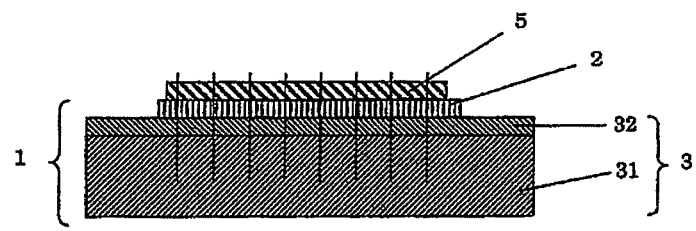

Next, as shown in FIG. 2B, the semiconductor wafer 4 is diced. Thereby, the semiconductor wafer 4 is cut into a prescribed size and individualized (is formed into small pieces) to produce semiconductor chips 5. The dicing is performed according to a normal method from the circuit face side of the semiconductor wafer 4, for example. Moreover, the present step can adopt, for example, a cutting method called full-cut that forms a slit reaching the dicing tape-integrated film for semiconductor back surface 1. The dicing apparatus used in the present step is not particularly restricted, and a conventionally known apparatus can be used. Further, since the semiconductor wafer 4 is adhered and fixed by the dicing tape-integrated film for semiconductor back surface 1 having the film for semiconductor back surface, chip crack and chip fly can be suppressed, as well as the damage of the semiconductor wafer 4 can also be suppressed. In this regard, when the film for semiconductor back surface 2 is formed of a resin composition containing an epoxy resin, generation of adhesive extrusion from the adhesive layer of the film for semiconductor back surface can be suppressed or prevented at the cut surface even when it is cut by dicing. As a result, re-attachment (blocking) of the cut surfaces themselves can be suppressed or prevented and thus the picking-up to be mentioned below can be further conveniently performed.

In the case where the dicing tape-integrated film for semiconductor back surface 1 is expanded, the expansion can be performed using a conventionally known expanding apparatus. The expanding apparatus has a doughnut-shaped outer ring capable of pushing the dicing tape-integrated film for semiconductor back surface 1 downward through a dicing ring and an inner ring which has a diameter smaller than the outer ring and supports the dicing tape-integrated film for semiconductor back surface. Owing to the expanding step, it is possible to prevent the damage of adjacent semiconductor chips through contact with each other in the picking-up step to be mentioned below.

(Picking-Up Step)

Figure 2C:
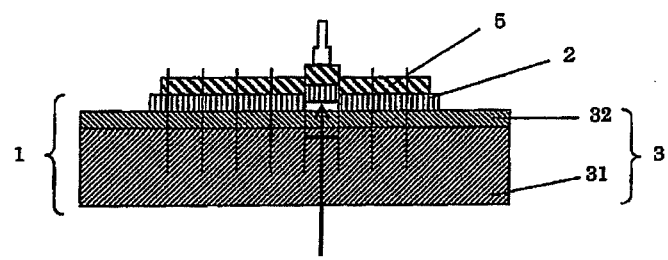

In order to collect the semiconductor chip 5 that is adhered and fixed to the dicing tape-integrated film for semiconductor back surface 1, picking-up of the semiconductor chip 5 is performed as shown in FIG. 2C to peel the semiconductor chip 5 together with the film for semiconductor back surface 2 from the dicing tape 3. The method of picking-up is not particularly restricted, and conventionally known various methods can be adopted. For example, there may be mentioned a method including pushing up each semiconductor chip 5 from the base material 31 side of the dicing tape-integrated film for semiconductor back surface 1 with a needle and picking-up the pushed semiconductor chip 5 with a picking-up apparatus. In this regard, the back surface of the picked-up semiconductor chip 5 is protected with the film for semiconductor back surface 2.

(Flip Chip Connection Step)

Figure 2D:
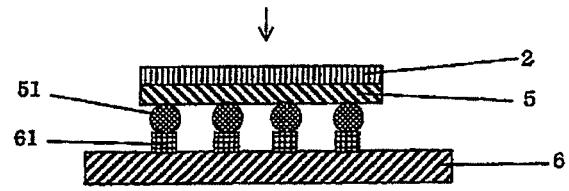
Figure 3:
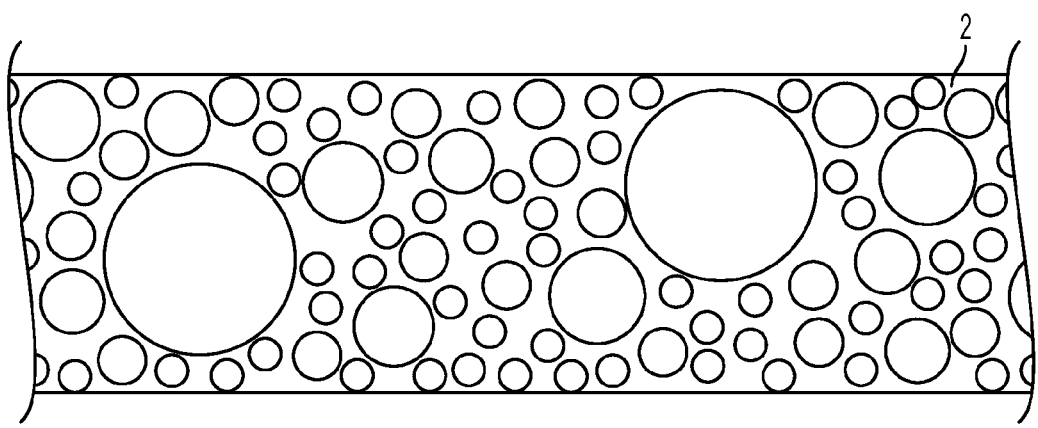
FIG. 3 is a cross-sectional schematic view showing one embodiment of a film for semiconductor back surface of the invention.

The picked-up semiconductor chip 5 is fixed to an adherend 6 such as a substrate by a flip chip bonding method (flip chip mounting method) as shown in FIG. 2D. Specifically, the semiconductor chip 5 is fixed to the adherend 6 according to a usual manner in a form where the circuit face (also referred to as a front face, circuit pattern-formed face, electrode-formed face, etc.) of the semiconductor chip 5 is opposed to the adherend 6. For example, the bump 51 formed at the circuit face side of the semiconductor chip 5 is brought into contact with a conductive material 61 (such as solder) for conjunction attached to a connecting pad of the adherend 6 and the conductive material 61 is melted under pressing, whereby electric connection between the semiconductor chip 5 and the adherend 6 can be secured and the semiconductor chip 5 can be fixed to the adherend 6 (flip chip bonding step). On this occasion, gaps are formed between the semiconductor chip 5 and the adherend 6 and the distance between the gaps is generally about 30 μm to 300 μm. In this regard, after the flip chip bonding (flip chip connecting) of the semiconductor chip 5 on the adherend 6, it is important that the opposing faces of the semiconductor chip 5 and the adherend 6 and the gaps are washed and an encapsulating material (such as an encapsulating resin) is then filled into the gaps to perform encapsulation.

As the adherend 6, various substrates such as lead frames and circuit boards (such as wiring circuit boards) can be used. The material of the substrates is not particularly restricted and there may be mentioned ceramic substrates and plastic substrates. Examples of the plastic substrates include epoxy substrates, bismaleimide triazine substrates, and polyimide substrates.

In the flip chip bonding step, the material of the bump and the conductive material is not particularly restricted and examples thereof include solders (alloys) such as tin-lead-based metal materials, tin-silver-based metal materials, tin-silver-copper-based metal materials, tin-zinc-based metal materials, and tin-zinc-bismuth-based metal materials, and gold-based metal materials and copper-based metal materials.

Incidentally, in the flip chip bonding step, the conductive material is melted to connect the bump at the circuit face side of the semiconductor chip 5 and the conductive material on the surface of the adherend 6. The temperature at the melting of the conductive material is usually about 260° C. (e.g., 250° C. to 300° C.). The dicing tape-integrated film for semiconductor back surface of the invention can be made to have thermal resistance capable of enduring the high temperature in the flip chip bonding step by forming the film for semiconductor back surface with an epoxy resin or the like.

In the present step, it is preferred to wash the opposing face (electrode-formed face) between the semiconductor chip 5 and the adherend 6 and the gaps. The washing liquid to be used at the washing is not particularly restricted and examples thereof include organic washing liquids and aqueous washing liquids. The film for semiconductor back surface in the dicing tape-integrated film for semiconductor back surface of the invention has solvent resistance against the washing liquid and has substantially no solubility to these washing liquid. Therefore, as mentioned above, various washing liquids can be employed as the washing liquid and the washing can be achieved by any conventional method without requiring any special washing liquid.

Next, an encapsulation step is performed for encapsulating the gaps between the flip chip-bonded semiconductor chip 5 and the adherend 6. The encapsulation step is performed using an encapsulating resin. The encapsulation conditions on this occasion are not particularly restricted but the curing of the encapsulating resin is usually carried out at 175° C. for 60 seconds to 90 seconds. However, in the invention, without limitation thereto, the curing may be performed at a temperature of 165 to 185° C. for several minutes, for example. By the thermal treatment in this step, not only the encapsulating resin but also the film for semiconductor back surface 2 is also thermally cured at the same time. Accordingly, both the encapsulating resin and the film for semiconductor back surface 2 are cured and shrunk with the procedure of the thermal curing. As a result, the stress to be given to the semiconductor chip 5 owing to the curing shrinkage of the encapsulating resin can be cancelled or relaxed through curing shrinkage of the film for semiconductor back surface 2. Moreover, in the step, the film for semiconductor back surface 2 can be completely or almost completely thermally cured and can be attached to the back surface of the semiconductor element with excellent close adhesiveness. Further, the film for semiconductor back surface 2 according to the invention can be thermally cured together with the encapsulating material in the encapsulation step even when the film is in an uncured state, so that it is not necessary to newly add a step for thermal curing of the film for semiconductor back surface 2.

The encapsulating resin is not particularly restricted as long as the material is a resin having an insulating property (an insulating resin) and may be suitably selected and used among known encapsulating materials such as encapsulating resins. The encapsulating resin is preferably an insulating resin having elasticity. Examples of the encapsulating resin include resin compositions containing an epoxy resin. As the epoxy resin, there may be mentioned the epoxy resins exemplified in the above. Furthermore, the encapsulating resin composed of the resin composition containing an epoxy resin may contain a thermosetting resin other than an epoxy resin (such as a phenol resin) or a thermoplastic resin in addition to the epoxy resin. Incidentally, a phenol resin can be utilized also as a curing agent for the epoxy resin and, as such a phenol resin, there may be mentioned phenol resins exemplified in the above.

According to the semiconductor device (flip chip-mounted semiconductor device) manufactured using the dicing tape-integrated film for semiconductor back surface 1 or the film for semiconductor back surface 2, the film for semiconductor back surface is attached to the back surface of the semiconductor chip, and therefore, laser marking can be applied with excellent visibility. In particular, even when the marking method is a laser marking method, laser marking can be applied with an excellent contrast ratio, and it is possible to observe various kinds of information (for example, literal information and graphical information) applied by laser marking with good visibility. At the laser marking, a known laser marking apparatus can be utilized. Moreover, as the laser, it is possible to utilize various lasers such as a gas laser, a solid-state laser, and a liquid laser. Specifically, as the gas laser, any known gas lasers can be utilized without particular limitation but a carbon dioxide laser ($CO_2$ laser) and an excimer laser (ArF laser, KrF laser, XeCl laser, XeF laser, etc.) are suitable. As the solid-state laser, any known solid-state lasers can be utilized without particular limitation but a YAG laser (such as Nd:YAG laser) and a $YVO_4$ laser are suitable.

Since the semiconductor device produced using the dicing tape-integrated film for semiconductor back surface 1 or the film for semiconductor back surface 2 of the invention is a semiconductor device mounted by the flip chip mounting method, the device has a thinned and miniaturized shape as compared with a semiconductor device mounted by a die-bonding mounting method. Thus, the semiconductor devices can be suitably employed as various electronic devices and electronic parts or materials and members thereof. Specifically, as the electronic devices in which the flip chip-mounted semiconductor devices of the invention are utilized, there may be mentioned so-called "mobile phones" and "PHS", small-sized computers [e.g., so-called "PDA" (handheld terminals), so-called "notebook-sized personal computer", so-called "Net Book (trademark)", and so-called "wearable computers", etc.], small-sized electronic devices having a form where a "mobile phone" and a computer are integrated, so-called "Digital Camera (trademark)", so-called "digital video cameras", small-sized television sets, small-sized game machines, small-sized digital audio players, so-called "electronic notepads", so-called "electronic dictionary", electronic device terminals for so-called "electronic books", mobile electronic devices (portable electronic devices) such as small-sized digital type watches, and the like. Needless to say, electronic devices (stationary type ones, etc.) other than mobile ones, e.g., so-called "desktop personal computers", thin type television sets, electronic devices for recording and reproduction (hard disk recorders, DVD players, etc.), projectors, micromachines, and the like may be also mentioned. In addition, electronic parts or materials and members for electronic devices and electronic parts are not particularly restricted and examples thereof include parts for so-called "CPU" and members for various memory devices (so-called "memories", hard disks, etc.).

EXAMPLES

The following will illustratively describe preferred Examples of the invention in detail. However, the invention is not limited to the following Examples unless it exceeds the gist thereof. Moreover, part in each example is a weight standard unless otherwise stated.

Example 1

40 parts of a phenoxy resin (trade name "EP4250" manufactured by JER Co., Ltd.), 129 parts of a phenolic resin (trade name "MEH-8320" manufactured by Meiwa Chemical Co., Ltd.), 1521 parts of an alumina filler (trade name "ALMEK30WT%-N40" manufactured by CIK Nanotec Co. Ltd., having an average particle size of 0.35 μm, a maximum particle size of 3.0 μm and a thermal conductivity of 40 W/mK), 14 parts of a dye (trade name "OIL BLACK BS" manufactured by Orient Chemical Industries Co., Ltd.), and 1 part of a curing catalyst (trade name "2PHZ-PW" manufactured by Shikoku Chemical Co., Ltd.) based on 100 parts of an epoxy resin (trade name "HP4032D" manufactured by DIC Co., Ltd.) were dissolved in methyl ethyl ketone to prepare a solution of a resin composition having a solid concentration of 23.6% by weight (this may be referred to as "resin composition solution A").

The resin composition solution A prepared as above was applied onto a releasably treated film, as a release liner (separator), composed of a polyethylene terephthalate film having a thickness of 50 μm, which had been subjected to a silicone-releasing treatment, and then dried at 130° C. for 2 minutes to prepare a film for flip chip type semiconductor back surface having a thickness of 10 μm (this may be referred to as "film A for semiconductor back surface").

Example 2

40 parts of a phenoxy resin (trade name "EP4250" manufactured by JER Co., Ltd.), 129 parts of a phenolic resin (trade name "MEH-8320" manufactured by Meiwa Chemical Co., Ltd.), 676 parts of an alumina filler (trade name "ALMEK30WT%-N40" manufactured by CIK Nanotec Co. Ltd., having an average particle size of 0.35 μm, a maximum particle size of 3.0 μm and a thermal conductivity of 40 W/mK), 14 parts of a dye (trade name "OIL BLACK BS" manufactured by Orient Chemical Industries Co., Ltd.), and 1 part of a curing catalyst (trade name "2PHZ-PW" manufactured by Shikoku Chemical Co., Ltd.) based on 100 parts of an epoxy resin (trade name "HP4032D" manufactured by DIC Co., Ltd.) were dissolved in methyl ethyl ketone to prepare a solution of a resin composition having a solid concentration of 23.6% by weight (this may be referred to as "resin composition solution B").

The resin composition solution B prepared as above was applied onto a releasably treated film, as a release liner (separator), composed of a polyethylene terephthalate film having a thickness of 50 μm, which had been subjected to a silicone-releasing treatment, and then dried at 130° C. for 2 minutes to prepare a film for flip chip type semiconductor back surface having a thickness of 10 μm (this may be referred to as "film B for semiconductor back surface").

Comparative Example 1

40 parts of a phenoxy resin (trade name "EP4250" manufactured by JER Co., Ltd.), 129 parts of a phenolic resin (trade name "MEH-8320" manufactured by Meiwa Chemical Co., Ltd.), 294 parts of an alumina filler (trade name "ALMEK30WT%-N40" manufactured by CIK Nanotec Co. Ltd., having an average particle size of 0.35 μm, a maximum particle size of 3.0 μm and a thermal conductivity of 40 W/mK), 14 parts of a dye (trade name "OIL BLACK BS" manufactured by Orient Chemical Industries Co., Ltd.), and 1 part of a curing catalyst (trade name "2PHZ-PW" manufactured by Shikoku Chemical Co., Ltd.) based on 100 parts of an epoxy resin (trade name "HP4032D" manufactured by DIC Co., Ltd.) were dissolved in methyl ethyl ketone to prepare a solution of a resin composition having a solid concentration of 23.6% by weight (this may be referred to as "resin composition solution C").

The resin composition solution C prepared as above was applied onto a releasably treated film, as a release liner (separator), composed of a polyethylene terephthalate film having a thickness of 50 μm, which had been subjected to a silicone-releasing treatment, and then dried at 130° C. for 2 minutes to prepare a film for flip chip type semiconductor back surface having a thickness of 10 μm (this may be referred to as "film C for semiconductor back surface").

Comparative Example 2

40 parts of a phenoxy resin (trade name "EP4250" manufactured by JER Co., Ltd.), 129 parts of a phenolic resin (trade name "MEH-8320" manufactured by Meiwa Chemical Co., Ltd.), 234 parts of an alumina filler (trade name "ALMEK30WT%-N40" manufactured by CIK Nanotec Co. Ltd., having an average particle size of 0.35 μm, a maximum particle size of 3.0 μm and a thermal conductivity of 40 W/mK), 14 parts of a dye (trade name "OIL BLACK BS" manufactured by Orient Chemical Industries Co., Ltd.), and 1 part of a curing catalyst (trade name "2PHZ-PW" manufactured by Shikoku Chemical Co., Ltd.) based on 100 parts of an epoxy resin (trade name "HP4032D" manufactured by DIC Co., Ltd.) were dissolved in methyl ethyl ketone to prepare a solution of a resin composition having a solid concentration of 23.6% by weight (this may be referred to as "resin composition solution D").

The resin composition solution D prepared as above was applied onto a releasably treated film, as a release liner (separator), composed of a polyethylene terephthalate film having a thickness of 50 μm, which had been subjected to a silicone-releasing treatment, and then dried at 130° C. for 2 minutes to prepare a film for flip chip type semiconductor back surface having a thickness of 10 μm (this may be referred to as "film D for semiconductor back surface").

Comparative Example 3

40 parts of a phenoxy resin (trade name "EP4250" manufactured by JER Co., Ltd.), 129 parts of a phenolic resin (trade name "MEH-8320" manufactured by Meiwa Chemical Co., Ltd.), 527 parts of an alumina filler, 14 parts of a dye (trade name "OIL BLACK BS" manufactured by Orient Chemical Industries Co., Ltd.), and 1 part of a curing catalyst (trade name "2PHZ-PW" manufactured by Shikoku Chemical Co., Ltd.) based on 100 parts of an epoxy resin (trade name "HP4032D" manufactured by DIC Co., Ltd.) were dissolved in methyl ethyl ketone to prepare a solution of a resin composition having a solid concentration of 23.6% by weight (this may be referred to as "resin composition solution E").

The resin composition solution E prepared as above was applied onto a releasably treated film, as a release liner (separator), composed of a polyethylene terephthalate film having a thickness of 50 μm, which had been subjected to a silicone-releasing treatment, and then dried at 130° C. for 2 minutes to prepare a film for flip chip type semiconductor back surface having a thickness of 10 μm (this may be referred to as "film E for semiconductor back surface").

Comparative Example 4

40 parts of a phenoxy resin (trade name "EP4250" manufactured by JER Co., Ltd.), 129 parts of a phenolic resin (trade name "MEH-8320" manufactured by Meiwa Chemical Co., Ltd.), 852 parts of an alumina filler, 14 parts of a dye (trade name "OIL BLACK BS" manufactured by Orient Chemical Industries Co., Ltd.), and 1 part of a curing catalyst (trade name "2PHZ-PW" manufactured by Shikoku Chemical Co., Ltd.) based on 100 parts of an epoxy resin (trade name "HP4032D" manufactured by DIC Co., Ltd.) were dissolved in methyl ethyl ketone to prepare a solution of a resin composition having a solid concentration of 23.6% by weight (this may be referred to as "resin composition solution F").

The resin composition solution F prepared as above was applied onto a releasably treated film, as a release liner (separator), composed of a polyethylene terephthalate film having a thickness of 50 μm, which had been subjected to a silicone-releasing treatment, and then dried at 130° C. for 2 minutes to prepare a film for flip chip type semiconductor back surface having a thickness of 10 μm (this may be referred to as "film F for semiconductor back surface").

<Average Particle Size and Maximum Particle Size of Filler>

The average particle size and the maximum particle size of the filler used in Examples and Comparative Examples were determined using a laser diffraction particle sizer (LA-910 manufactured by HORIBA Ltd.). The results are shown in Table 1 below.

<Thermal Conductivity>

The film for flip chip type semiconductor back surface produced in each Examples and Comparative Examples was thermally cured by heat treatment in a drier at 175° C. for 1 hour. Subsequently, according to TWA (thermal wave analysis with ai-Phase Mobile manufactured by ai-Phase Co., Ltd.), the thermal diffusion α ($m^2$/sec) through each film for semiconductor back surface was measured. Next, the specific heat Cp (J/g·° C.) of each film for semiconductor back surface was measured through DSC. For measuring the specific heat, SII Nanotechnology's DSC6220 was used under the condition of a temperature of from 20 to 300° C. at a heating rate of 10° C./min. Based on the obtained experimental data, the specific heat was computed according to JIS Handbook (specific heat capacity measuring method K-7123). Further, the specific gravity of the film for semiconductor back surface was measured.

Based on the thermal diffusion α, the specific heat Cp and the specific gravity determined through the above-mentioned measurement, the thermal conductivity was computed according to the following formula. The results are shown in Table 1 below.

Thermal Conductivity (W/m·K)=thermal diffusion ($m^2$/sec)×specific heat (J/g·° C.)×specific gravity (g/$cm^3$)

<Measurement of Surface Roughness (Ra) of Film for Semiconductor Back Surface>

The surface roughness (Ra) of the exposed side (opposite to the release liner side) of each film for semiconductor back surface A to F was measured with a non-contact three-dimensional roughness gauge (NT3300 manufactured by Veeco Instruments Inc.), according to JIS B0601. The measurement condition was fiftyfold-power. The found data were processed through a median filter to give the intended roughness value. Each film for flip chip type semiconductor back surface was analyzed at different 5 sites therein, and the data were averaged to give the surface roughness (Ra) of the film.

<Evaluation of Adhesiveness of Film for Semiconductor Back Surface to Semiconductor Wafer>

The adhesive force (peeling force) of the film for semiconductor back surface to semiconductor wafer was measured as follows: A silicon wafer as a semiconductor wafer was put on a hot plate, and at a predetermined temperature (50° C.), the film for semiconductor back surface having a length of 150 mm and a width of 10 mm, of which the back surface had been reinforced with an pressure-sensitive adhesive tape (trade name BT315, manufactured by Nitto Denko Co., Ltd.), was attached thereto by pressing with a 2-kg roller moved once back and forth thereon. Subsequently, this was kept on the hot plate (50° C.) for 2 minutes, and then kept at room temperature (23° C. or so) for 20 minutes; and after thus left, using a peeling tester (trade name "Autograph AGS-J" manufactured by Shimadzu Seisaku-sho Co., Ltd.), the back-reinforced film for semiconductor back surface was peeled at a temperature of 23° C., at a peeling angle of 180° and at a pulling rate of 300 mm/min (that is, the film for semiconductor back surface was peeled from the semiconductor wafer at the interface between the two), and the maximum peeling load (the maximum load except the initial peak top) was measured. The maximum load was taken as the adhesiveness between the film for semiconductor back surface and the semiconductor wafer (the adhesiveness of the film for semiconductor back surface to the semiconductor wafer), from which the peeling force (N/10 mm width) of the film for semiconductor back surface was derived.

<Evaluation of Laser Markability of Film for Semiconductor Back Surface>

The film for semiconductor back surface in the sample of the film for semiconductor back surface attached to a semiconductor wafer that had been prepared in the above-mentioned <Evaluation of Adhesiveness of Film for Semiconductor Back Surface to Semiconductor Wafer> was laser-marked with a YAG laser, and the laser-marked information (barcode information) was analyzed according to the evaluation standards mentioned below, whereby the laser markability of the film for semiconductor back surface of Examples and Comparative Examples was evaluated.

(Laser Markability Evaluation Standards)+

+: Of 10 adults selected randomly, at least 8 confirmed good visibility of the laser-marked information.

−: Of 10 adults selected randomly, at most 7 confirmed good visibility of the laser-marked information.

TABLE 1

| | Filler Content (vol. %) | Filler Content (wt. %) | Average Particle Size of Filler (μm) | Maximum Particle Size of Filler (μm) | Film Thickness (μm) | Surface Roughness (nm) | Thermal Conductivity (W/mK) | Adhesiveness (N/10 mm width) | Laser Markability |
|---|---|---|---|---|---|---|---|---|---|
| Example 1 | 69 | 84 | 0.35 | 3.0 | 10 | 220 | 3.2 | 1.5 | + |
| Example 2 | 50 | 70 | 0.35 | 3.0 | 10 | 170 | 2.3 | 1.8 | + |
| Comparative Example 1 | 37 | 51 | 0.35 | 3.0 | 10 | 150 | 1.1 | 2.0 | + |
| Comparative Example 2 | 27 | 45 | 0.35 | 3.0 | 10 | 130 | 0.7 | 2.1 | + |
| Comparative Example 3 | 50 | 65 | 3.5 | 7.5 | 10 | 380 | 2.0 | 0.4 | − |
| Comparative Example 4 | 55 | 75 | 2.8 | 9.0 | 10 | 400 | 2.1 | 0.3 | − |

(Results)

As shown from Table 1, the films for semiconductor back surface of Examples 1 and 2, in which the content of the thermoconductive filler is at least 50% by volume and the average particle size and the maximum particle size of the thermoconductive filler are at most 30% and at most 80%, respectively, of the thickness of the film for semiconductor back surface, have good thermal conductivity and the surface roughness of the films is low. In addition, the adhesiveness of the films for semiconductor back surface to semiconductor wafers and the laser markability thereof are good. On the other hand, the films for semiconductor back surface of Comparative Examples 1 and 2, in which the content of the thermoconductive filler is less than 50% by volume, have low thermal conductivity. The films for semiconductor back surface, in which the average particle size and the maximum particle size of the thermoconductive filler are more than 30% and more than 80%, respectively, of the thickness of the film for semiconductor back surface, could have good thermal conductivity, but the surface roughness thereof is great and the adhesiveness of the films for semiconductor back surface to semiconductor wafers and the laser markability thereof are poor.

While the present invention has been described in detail and with reference to specific embodiments thereof, it will be apparent to one skilled in the art that various changes and modifications can be made therein without departing from the scope thereof.

This application is based on Japanese patent application No. 2010-170931 filed Jul. 29, 2010, the entire contents thereof being hereby incorporated by reference.

What is claimed is:

1. A film for flip chip type semiconductor back surface, which is to be disposed on the back surface of a semiconductor element to be flip chip-connected onto an adherend,
   said film comprising a resin and a thermoconductive filler,
      wherein the content of the thermoconductive filler is at least 50% by volume of said film, and
      wherein the thermoconductive filler has an average particle size relative to the thickness of said film of at most 30% and has a maximum particle size relative to the thickness of said film of at most 80%.

2. The film for flip chip type semiconductor back surface according to claim 1, wherein said film has a thermal conductivity of at least 2 W/mK.

3. The film for flip chip type semiconductor back surface according to claim 1, wherein said film has a surface roughness (Ra) of at most 300 nm on the side opposite to the side thereof to face the back surface of the semiconductor element.

4. The film for flip chip type semiconductor back surface according to claim 1, wherein the content of the thermoconductive filler is from 50 to 80% by volume of said film, and
   wherein the average particle size of the thermoconductive filler relative to the thickness of said film is from 10 to 30% and the maximum particle size thermoconductive filler relative to the thickness of said film is from 40 to 80%.

5. The film for flip chip type semiconductor back surface according to claim 1, wherein the thermoconductive filler comprises a plurality of thermoconductive filler particles having different average particle sizes.

6. A dicing tape-integrated film for semiconductor back surface, which comprises:
   a dicing tape; and
   the film for flip chip type semiconductor back surface according to claim 1, which is laminated on the dicing tape,
   wherein the dicing tape comprises a base material and a pressure-sensitive adhesive layer laminated on the base material, and
   wherein the film for flip chip type semiconductor back surface is laminated on the pressure-sensitive adhesive layer of the dicing tape.

7. A method for producing a semiconductor device by using the dicing tape-integrated film for semiconductor back surface according to claim 6, the method comprising:
   attaching a semiconductor wafer onto the film for flip chip type semiconductor back surface of the dicing tape-integrated film for semiconductor back surface,
   dicing the semiconductor wafer to form a semiconductor element,
   peeling the semiconductor element from the pressure-sensitive adhesive layer of the dicing tape, along with the film for flip chip type semiconductor back surface, and
   flip chip-connecting the semiconductor element onto an adherend.

8. A flip chip type semiconductor device produced in accordance with said method according to claim 7.

* * * * *